US008914251B2

(12) United States Patent
Ohta

(10) Patent No.: US 8,914,251 B2
(45) Date of Patent: Dec. 16, 2014

(54) STORAGE MEDIUM STORING DIGITAL DATA CORRECTION PROGRAM AND DIGITAL DATA CORRECTION APPARATUS

(75) Inventor: Keizo Ohta, Kyoto (JP)

(73) Assignee: Nintendo Co., Ltd., Kyoto (JP)

( * ) Notice: Subject to any disclaimer, the term of this patent is extended or adjusted under 35 U.S.C. 154(b) by 412 days.

(21) Appl. No.: 12/498,576

(22) Filed: Jul. 7, 2009

(65) Prior Publication Data

US 2010/0009761 A1 Jan. 14, 2010

(30) Foreign Application Priority Data

Jul. 11, 2008 (JP) ................. 2008-181804

(51) Int. Cl.
A63F 9/24 (2006.01)
H03M 1/06 (2006.01)
G01C 19/06 (2006.01)
H03M 1/12 (2006.01)

(52) U.S. Cl.
CPC .......... *H03M 1/0658* (2013.01); *G01C 19/065* (2013.01); *A63F 2300/1018* (2013.01); *A63F 2300/105* (2013.01); *H03M 1/12* (2013.01)
USPC .......................................................... 702/85

(58) Field of Classification Search
USPC .......................................................... 702/85
See application file for complete search history.

(56) References Cited

U.S. PATENT DOCUMENTS

2004/0210411 A1 10/2004 Koo et al.

FOREIGN PATENT DOCUMENTS

| EP | 1 936 465 A2 | 6/2008 |
| JP | 59-094017 | 5/1984 |
| JP | 10-097375 | 4/1998 |
| JP | 11-118651 | 4/1999 |
| JP | 2002-023919 | 1/2002 |
| JP | 2004-317518 | 11/2004 |

OTHER PUBLICATIONS

Office Action (7 pgs.) dated Feb. 4, 2011 issued in corresponding European Application No. 09164382.5-1233.
Sep. 11, 2012 Office Action for JP2009-241176, 2 pages.

*Primary Examiner* — Tung S Lau
(74) *Attorney, Agent, or Firm* — Nixon & Vanderhye PC

(57) ABSTRACT

Digital data obtained by converting, by an A/D converter, an angular velocity measured by a sensor is transmitted from a remote control to a game machine. A CPU of the game machine corrects the digital data. That is, the CPU sequentially stores sequential digital data in a buffer. A stable range (d1-d2) in which each digital data can be defined to be stable is calculated for the latest digital data. An average value of those of the digital data stored in the buffer that are consecutively present in the stable range retrogressively from the latest digital data is calculated. Using the average value, the latest digital data is corrected.

32 Claims, 12 Drawing Sheets

100

STORAGE MEDIUM STORING DIGITAL DATA CORRECTION PROGRAM AND DIGITAL DATA CORRECTION APPARATUS

CROSS REFERENCE OF RELATED APPLICATION

The disclosure of Japanese Patent Application No. 2008-181804, filed Jul. 11, 2008 is incorporated herein by reference.

BACKGROUND

1. Field

Example embodiments of the present invention relate to a storage medium storing a digital data correction program and a digital data correction apparatus. More particularly, example embodiments of the present invention relates to a storage medium storing a digital data correction program and a digital data correction apparatus that correct digital data outputted from a device that converts an output value from a sensor that outputs an analog value, into digital data and outputs the digital data.

2. Description of the Related Art

For example, when a device that converts an output value (analog value) from a sensor, such as a gyroscope, that outputs an angular velocity in an analog value into digital integer value data and outputs the digital integer value data is used in a controller of a game machine that is operated by a person holding it with his/her hand, association between analog values and digital integer value data and an analog value indicating that the angular velocity is zero are defined in advance. When digital integer value data obtained from the device is smaller than digital integer value data associated with the analog value indicating that the angular velocity is zero, the data is recognized as a negative angular velocity, and when larger, the data is recognized as a positive angular velocity.

However, the device that converts an output value outputted from a sensor that outputs an analog value into digital integer value data in the above-described manner has problems such as those shown below.

First, a deviation occurs in association between an output value (analog value) outputted from the sensor that outputs an analog value and digital integer value data obtained by converting the analog value. For example, given that the sensor voltage for a state in which the sensor is stationary (the angular velocity is zero) is 2.9 V, when a voltage obtained from the sensor is converted into digital integer value data, voltages in a range of 2.4 V (=2.9−0.5) to 3.4 V (=2.9+0.5) should be converted into integer value data indicating that the angular velocity is zero but voltages in the range are not always converted into integer value data indicating that the angular velocity is zero, due to individual differences between sensors and the like, and voltages in a range of, for example, 2.0 V (=2.9−0.9) to 3.0 V (=2.9+0.1) may be converted into integer value data indicating that the angular velocity is zero.

As a result, in the case of an ideal environment/condition where voltages in the range of 2.4 V (=2.9−0.5) to 3.4 V (=2.9+0.5) are converted into integer value data indicating that the angular velocity is zero, in whichever direction the voltage moves from 2.9 V, when the voltage is changed by an identical amount of "0.5 V", the integer value data is changed by "+1" or "−1". On the other hand, in the case of an environment/condition where voltages in the range of 2.0 V (=2.9−0.9) to 3.0 V (=2.9+0.1) are converted into integer value data indicating that the angular velocity is zero, a phenomenon occurs that while the integer value data is not decremented unless a change of 0.9 V is made on the negative side, the integer value data is incremented when a change of only 0.1 V is made on the positive side. That is, a deviation has occurred in association between an output value (analog value) outputted from the sensor that outputs an analog value and digital integer value data obtained by converting the analog value.

The second problem is a temperature drift problem. For example, by a change in the temperature of an environment where a game is played, the sensor voltage for a state in which the sensor is stationary (the angular velocity is zero) changes during the use of the controller. For example, an event occurs that the voltage indicating a stationary state is 2.9 V up until a certain point in time but is changed to 3.3 V at some point in time. Therefore, during game play, despite the fact that the controller, i.e., the gyroscope, is stationary, integer value data indicating as if in move is outputted.

Related art that can deal with the first problem of analog/digital conversion is disclosed in Japanese Unexamined Patent Publication No. 11-118651 [G01L19/08].

In a digital manometer described as conventional art in Japanese Unexamined Patent Publication No. 11-118651, when an input value fluctuates greater than a predetermined specified value, the input value is outputted as it is as an output value, and when fluctuation in input value is less than or equal to the predetermined specified value, input values are accumulated and averaged and the averaged value is outputted.

In the related art of Japanese Unexamined Patent Publication No. 11-118651, since a certain number of input values are targeted for averaging, when a certain small number of input values are averaged, the accuracy of an output value lowers. When, on the other hand, the number of input values to be averaged is increased, trackability becomes worse. For example, when the state is changed from one in which fluctuation in input value exceeds the specified value to one in which fluctuation in input value is smaller than the specified value, a large number of input values that are greater than the specified value are targeted for averaging and accordingly an averaged output value may become larger than the actual value.

SUMMARY

Therefore, it is one aspect of example embodiments of the present invention to provide a novel digital data correction program and digital data correction apparatus.

It is another aspect of example embodiments of the present invention to provide a digital data correction program and a digital data correction apparatus that can effectively deal with the analog/digital conversion problem.

It is still another aspect of example embodiments of the present invention to provide a digital data correction program and a digital data correction apparatus wherein the accuracy of output digital data is high and moreover trackability is not bad.

To solve the above-described problems, example embodiments of the present invention adopt the following configurations. It is to be understood that reference numerals, supplemental remarks, and the like in parentheses illustrate the corresponding relationship with an embodiment, as will be described later, to assist in the understanding of example embodiments of the present invention, and thus are not intended to limit the present invention in any way.

A first aspect of example embodiments of the invention is directed to a storage medium that stores a digital data correction program in such a manner that the program is readable by a computer of a digital data correction apparatus that corrects digital data obtained by converting, by an A/D conversion means, an analog quantity measured by a predetermined sensor, the digital data correction program causing the computer to perform as: a buffer means for sequentially storing digital data converted by the A/D conversion means; a stable range calculation means for calculating a stable range for latest digital data converted by the A/D conversion means; an average value calculation means for calculating an average value of those of the digital data stored in the buffer means that are consecutively present in the stable range retrogressively from the latest digital data; and a data correction means for correcting the latest digital data using the average value calculated by the average value calculation means.

In the first aspect of example embodiments of the invention, an analog quantity measured by a sensor (56: a reference numeral exemplifying a corresponding portion in the embodiment, the same below) is converted into digital data by an A/D conversion means (58$a$, 58$b$). The digital data is transmitted from a controller (14) to a game machine (12) via, for example, short-range radio and a CPU (60) of the game machine (12) corrects the digital data. That is, the CPU (60) of the game machine (12) cooperates with a memory means (62$e$, 66) to function as a buffer means (100) for sequentially storing digital data converted by the A/D conversion means. A stable range calculation means (S37) calculates, for the latest digital data, an upper limit and a lower limit (d1, d2) of a stable range in which each digital data can be defined to be stable. An average value calculation means (S49) calculates an average value of those of the digital data sequentially stored in the buffer means (100) that are consecutively present in the stable range retrogressively from digital data obtained this time. A data correction means (S49) corrects the latest digital data using the average value.

According to the first aspect of example embodiments of the invention, since digital data that are consecutively present in the stable range are averaged to correct the latest digital data, a correction with good trackability can be made during operation and a highly accurate correction can be smoothly made during a stationary (stable) state.

A second aspect of example embodiments of the invention is directed to a storage medium dependent from the first aspect of example embodiments of the invention, wherein the digital data correction program further causes the computer to function as a number-of-consecutive-unit calculation means for calculating a number of consecutive units of those of the digital data stored in the buffer means that are consecutively present in the stable range retrogressively from the latest digital data, and the data correction means includes a weighted average value calculation means for calculating a weighted average value of the latest digital data and the average value based on the number of consecutive units, and uses the weighted average value as corrected digital data.

In the second aspect of example embodiments of the invention, a number-of-consecutive-unit calculation means (S43) computes a number of consecutive units (ct) of those of the digital data stored in the buffer means that are present in the stable range retrogressively from the latest digital data. The data correction means (S49) calculates a weighted average value of the latest digital data and an average value computed by the average value calculation means, based on the number of consecutive units calculated by the number-of-consecutive-unit calculation means, and uses the weighted average value as corrected digital data. According to the second aspect of example embodiments of the invention, since a weighted average is used, the reliability of corrected digital data increases.

A third aspect of example embodiments of the invention is directed to a storage medium dependent from the second aspect of example embodiments of the invention, wherein the weighted average value calculation means makes a weight of the average value heavier as the number of consecutive units becomes larger.

In the third aspect of example embodiments of the invention, the accuracy of corrected digital data obtained during a stationary (stable) state is high.

A fourth aspect of example embodiments of the invention is directed to a storage medium dependent from the third aspect of example embodiments of the invention, wherein the weighted average value calculation means makes the weight of the average value heavier in proportion to a power of the number of consecutive units.

In the fourth aspect of example embodiments of the invention also, the accuracy of corrected digital data obtained during a stationary (stable) state is high.

A fifth aspect of example embodiments of the invention is directed to a storage medium dependent from the first aspect of example embodiments of the invention, wherein the stable range is a range including the latest digital data.

In the fifth aspect of example embodiments of the invention, since the stable range is set to include the latest digital data, the reliability of corrected digital data is not impaired.

A sixth aspect of example embodiments of the invention is directed to a storage medium dependent from the fifth aspect of example embodiments of the invention, wherein the stable range is a range with equal upper and lower bounds with the latest digital data being a center.

In the sixth aspect of example embodiments of the invention, an upper limit value and a lower limit value of a stable range are set to values obtained by increasing/decreasing a predetermined value with respect to the latest digital data. According to the sixth aspect of example embodiments of the invention, a stable-state determination can be made without bias and thus a highly accurate correction can be made.

A seventh aspect of example embodiments of the invention is directed to a storage medium dependent from the first aspect of example embodiments of the invention, wherein the digital data correction program further causes the computer to function as: a number-of-consecutive-unit calculation means for calculating a number of consecutive units of those of the digital data stored in the buffer means that are consecutively present in the stable range retrogressively from the latest digital data; a modification offset value calculation means for calculating, according to the number of consecutive units, a modification offset value that converges to digital data corrected by the data correction means; and an offset correction means for correcting the digital data corrected by the data correction means, using the modification offset value.

In the seventh aspect of example embodiments of the invention, a number-of-consecutive-unit calculation means (S43) calculates a number of consecutive units of those of the digital data stored in the buffer means that are consecutively present in the stable range retrogressively from the latest digital data, and a modification offset value calculation means (S53) calculates, according to the number of consecutive units, a modification offset value that converges to corrected digital data. Then, an offset correction means (S55) corrects the corrected digital data, using the modification offset value. Accordingly, corrected digital data that is corrected using the modification offset value is adopted. In the seventh aspect of example embodiments of the invention, since a modification offset value according to the number of consecutive units is used, a highly accurate offset correction can be achieved.

An eighth aspect of example embodiments of the invention is directed to a storage medium dependent from the seventh aspect of example embodiments of the invention, wherein the modification offset value calculation means calculates a modification offset value with a higher level of convergence to the digital data corrected by the data correction means, as the number of consecutive units becomes larger.

In the eighth aspect of example embodiments of the invention also, a highly accurate offset correction can be achieved.

A ninth aspect of example embodiments of the invention is directed to a storage medium dependent from the eighth aspect of example embodiments of the invention, wherein the modification offset value calculation means calculates a modification offset value with a higher level of convergence to the digital data corrected by the data correction means, in proportion to a power of the number of consecutive units.

In the ninth aspect of example embodiments of the invention also, a highly accurate offset correction can be achieved.

A tenth aspect of example embodiments of the invention is directed to a storage medium dependent from the first aspect of example embodiments of the invention, wherein the data correction means includes a data output means for outputting corrected digital data that is obtained by correcting the latest digital data using the average value calculated by the average value calculation means.

In the tenth aspect of example embodiments of the invention, the data correction means (S49) outputs corrected digital data. Specifically, the data correction means outputs, for example, corrected data computed by a computational expression shown in the step S49.

An eleventh aspect of example embodiments of the invention is directed to a storage medium dependent from the first aspect of example embodiments of the invention, wherein the sensor includes a gyroscope and the digital data is angular velocity data.

In the eleventh aspect of example embodiments of the invention, since a gyroscope can be used, it is suitable for a game machine and the like.

A twelfth aspect of example embodiments of the invention is directed to a storage medium dependent from the eleventh aspect of example embodiments of the invention, wherein the gyroscope is provided to a controller of a game machine and the game machine performs game processing based on the digital data.

In the twelfth aspect of example embodiments of the invention, by using a gyroscope, highly accurate game processing is possible.

A thirteenth aspect of example embodiments of the invention is directed to a digital data correction apparatus that corrects digital data obtained by converting, by an A/D conversion means, an analog quantity measured by a predetermined sensor, the apparatus including: a buffer means for sequentially storing digital data converted by the A/D conversion means; a stable range calculation means for calculating a stable range for latest digital data converted by the A/D conversion means; an average value calculation means for calculating an average value of those of the digital data stored in the buffer means that are consecutively present in the stable range retrogressively from the latest digital data; and a data correction means for correcting the latest digital data using the average value calculated by the average value calculation means.

According to the thirteenth aspect of example embodiments of the invention, the same effects as those obtained by the first aspect of example embodiments of the invention can be expected.

According to example embodiments of the present invention, antinomic requests, i.e., an improvement in the accuracy of digital data and an improvement in trackability, can be effectively met.

The above features, and advantages of example embodiments of the present invention will become more apparent from the following detailed description of example embodiments when taken in conjunction with the accompanying drawings.

BRIEF DESCRIPTION OF THE DRAWINGS

FIG. 2(A) is a perspective view of the remote control as seen from the upper rear and FIG. 2(B) is a perspective view of the remote control as seen from the lower front;

FIG. 3(A) is a perspective view of the gyroscope unit as seen from the upper front and FIG. 3(B) is a perspective view of the gyroscope unit as seen from the lower rear;

DETAILED DESCRIPTION OF THE NON-LIMITING EXAMPLE EMBODIMENTS

Figure 1:
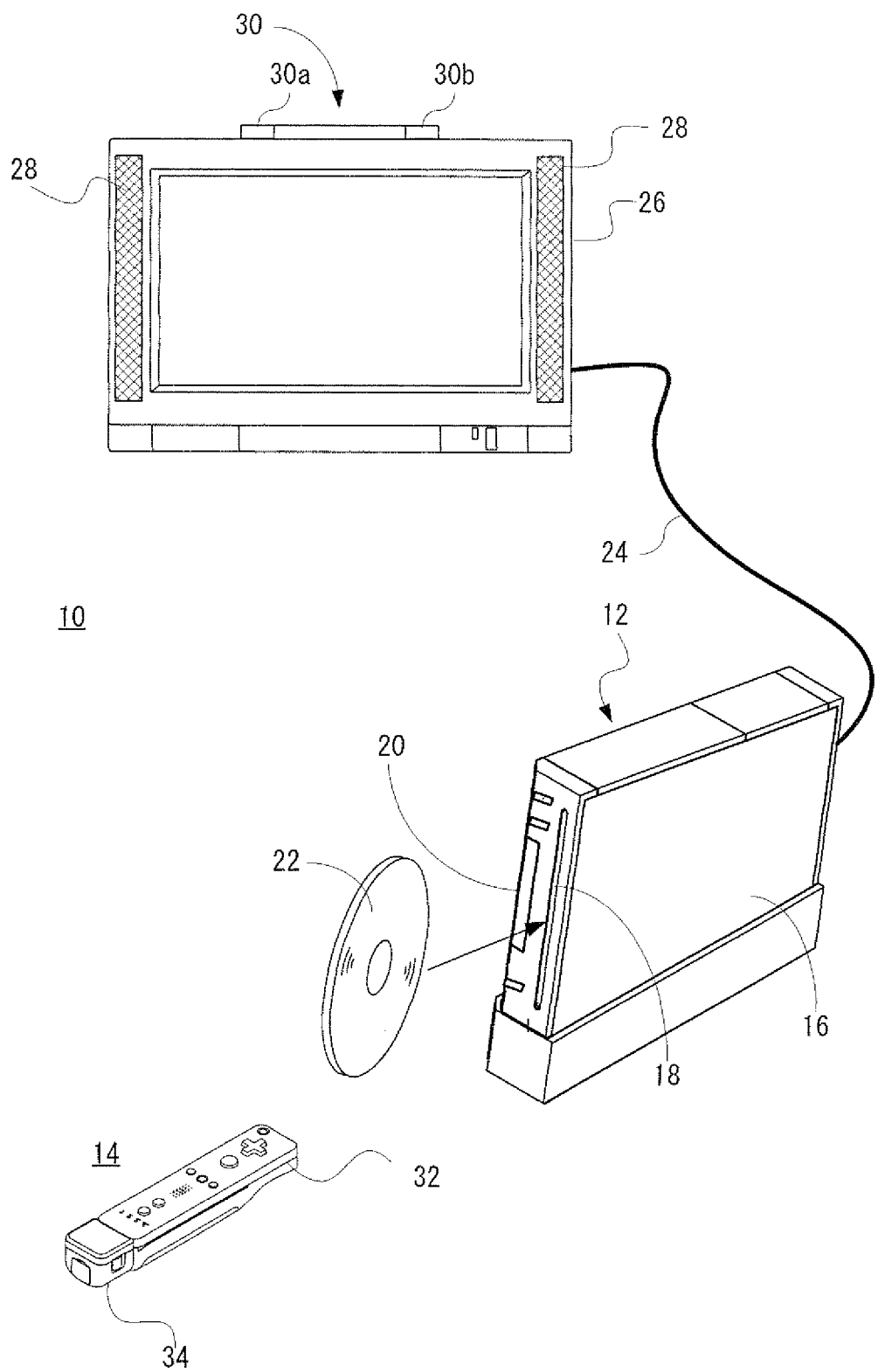
FIG. 1 is a block diagram showing a configuration of one embodiment of the present invention.

With reference to FIG. 1, a game system 10 that is one embodiment of the present invention includes a video game apparatus (hereinafter may be simply referred to as the "game apparatus") 12 and a controller 14. The controller 14 functions as an input apparatus or operation apparatus (device) for a user or player. The game apparatus 12 and the controller 14 are wirelessly connected to each other. For example, wireless communication is performed according to the Bluetooth (registered trademark) standard but may be performed according to other standards such as infrared and wireless LAN standards.

The game apparatus 12 includes a substantially rectangular parallelepiped housing 16. On the front of the housing 16 are provided a disk slot 18 and an external memory card slot cover 20. An optical disk 22 that is an example of an information storage medium storing a game program and data is inserted from the disk slot 18 and is thereby placed in a disk drive 74 (FIG. 4) in the housing 16. An external memory card connector 82 (FIG. 4) is provided inside the external memory card slot cover 20. An external memory card (not shown) is inserted into the external memory card connector 82. The external memory card is used to load and temporarily store a game program and the like read from the optical disk 22 or save game data (result data or midway data) of a game played using the game system 10. The game data may be saved in, for example, an internal memory such as a flash memory 64 (FIG. 4), instead of the external memory card.

On the rear of the housing 16 of the game apparatus 12 is provided an AV cable connector (not shown). Using the AV cable connector, the game apparatus 12 is connected to a monitor (display) 26 through an AV cable 24. The monitor 26 is typically a color television receiver. The AV cable 24 inputs a video signal from the game apparatus 12 to a video input terminal of the color television and inputs an audio signal to an audio input terminal. Accordingly, for example, a game image of a 3D video game is displayed on a screen of the color television (monitor) 26 and stereo game audio such as a game music and sound effects is outputted from built-in speakers 28.

A marker section 30 including two infrared LEDs (markers) 30a and 30b is provided on the periphery of the monitor 26 (on the top of the monitor 26 in the present embodiment). The marker section 30 is connected to the game apparatus 12 through a power supply cable (not shown). Hence, power is supplied to the marker section 30 from the game apparatus 12. In this manner, the markers 30a and 30b emit light and output infrared light toward the front of the monitor 26.

Note that power is provided to the game apparatus 12 by a common AC adapter (not shown). The AC adapter is connected to a standard household wall socket and converts household power to a low DC voltage signal suitable for driving the game apparatus 12. In another embodiment, a battery may be used as a power supply.

The controller 14 includes, although details will be described later, a remote control 32 that can be held by one hand and a gyroscope unit 34 that is removably mounted on the remote control 32. Since the gyroscope unit 34 is physically and electrically coupled to the remote control 32, input data or operation data and angular velocity data indicating angular velocities of the remote control 32 detected by the gyroscope unit 34 are outputted from the remote control 32.

In the game system 10, to play a game (or another application), the user first turns on power to the game apparatus 12. Then, the user selects an appropriate optical disk 22 storing a video game (or another application to be executed) and loads the optical disk 22 into the disk drive 74 from the disk slot 18 of the game apparatus 12. In response thereto, the game apparatus 12 starts to execute the video game or another application based on software stored on the optical disk 22. The user operates the controller 14 to provide an input to the game apparatus 12.

Figure 2:
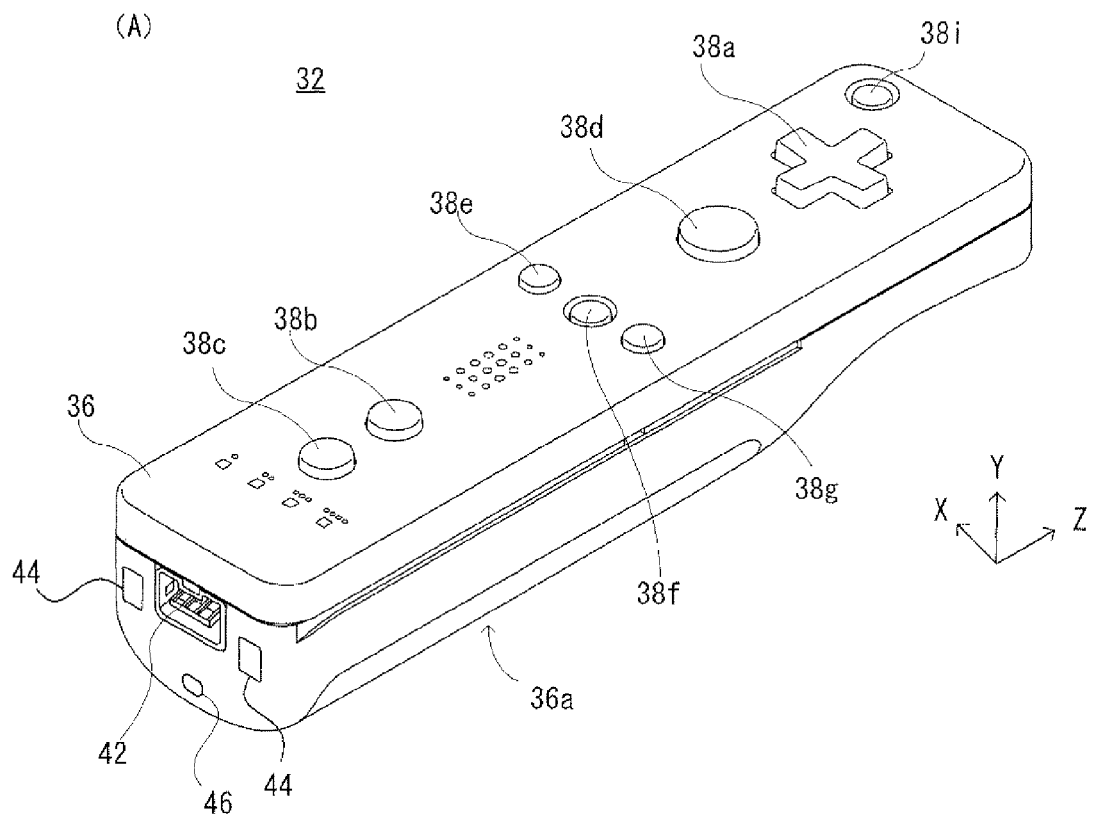
FIG. 2 is an illustrative view showing the external appearance of a controller (remote control) applied to the embodiment in FIG. 1.
Figure 2:
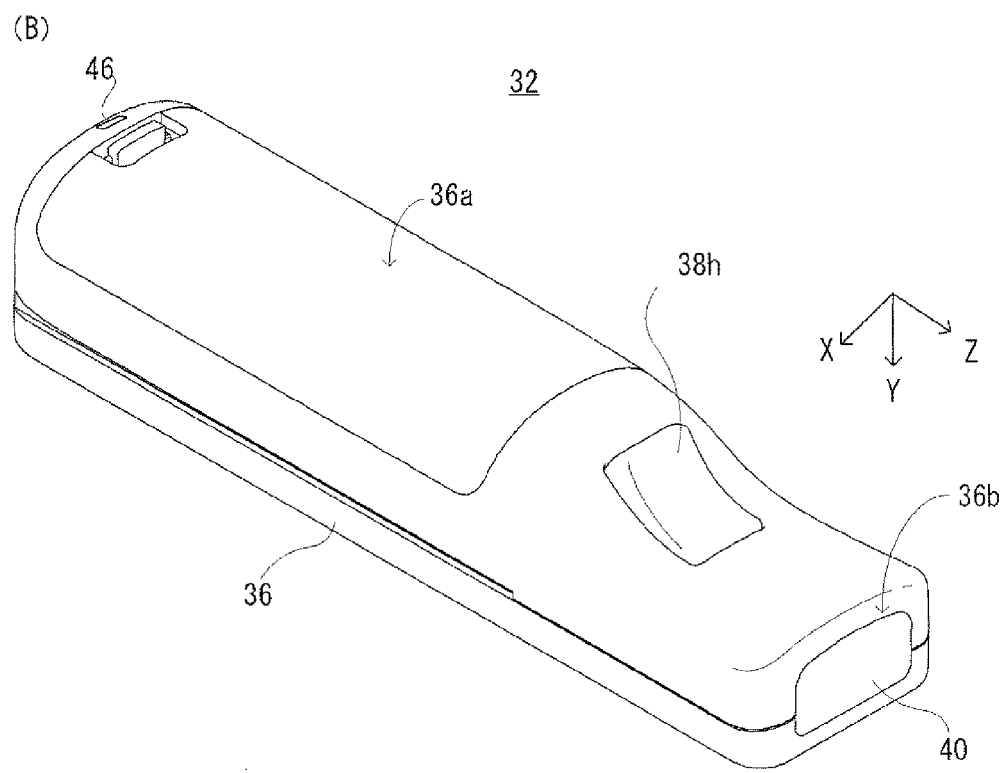

FIG. 2 shows an example of the external appearance of the remote control 32. FIG. 2(A) is a perspective view of the remote control 32 as seen from the upper rear and FIG. 2(B) is a perspective view of the remote control 32 as seen from the lower front.

The remote control 32 has a housing 36 formed by, for example, plastic molding. The housing 36 has a substantially rectangular parallelepiped shape with a front/rear direction (Z-axis direction) thereof being a longitudinal direction. The housing 36, as a whole, has a size allowing an adult or child to hold it with his/her one hand. As an example, the housing 36 has a size having substantially the same length or width of a human palm. The player can perform a game operation using the remote control 32 by pressing buttons provided thereon or changing the position or orientation of the remote control 32 itself.

The housing 36 is provided with a plurality of operation buttons. Specifically, on the top of the housing 36 are provided a cross key 38a, a "1" button 38b, a "2" button 38c, an "A" button 38d, a "− (minus)" button 38e, a HOME button 38f, and a "+ (plus)" button or start button 38g. On the bottom of the housing 36 is formed a recessed portion and a "B" button 38h is provided on a sloping surface on the rear side of the recessed portion. These buttons (switches) 38a to 38h are assigned with appropriate functions according to a game program to be executed by the game apparatus 12. Further, on the top of the housing 36 is provided a power switch 38i for remotely turning on/off power to a main body of the game apparatus 12. The buttons (switches) provided on the remote control 32 may be collectively represented by an operation means or input means using reference numeral 38.

The cross key 38a is a four-direction push switch and includes operation portions for four directions indicated by arrows, i.e., forward (or up), backward (or down), right, and left. By operating one of these operation portions, the moving direction of a character or object (player character or player object) that can be operated by the player can be instructed or a cursor moving direction can be instructed or simply a direction can be instructed.

The "1" button 38b and the "2" button 38c are press-button switches. For example, they are used for a game operation such as adjusting a viewpoint position or viewpoint direction when a three-dimensional game image is displayed, i.e., the position or view angle of a virtual camera. Alternatively, the "1" button 38b and the "2" button 38c may be used when the same operations as or auxiliary operations of those of the "A" button 38d and the "B" button 38h are performed.

The "A" button switch 38d is a press-button switch and is used to cause a player character or player object to perform an action other than a direction instruction, i.e., an action such as hitting (punching), throwing, catching (obtaining), riding, or jumping. For example, in an action game, jumping, punching, moving a weapon, and the like, can be instructed. In a role-playing game (RPG) or simulation RPG, obtaining of an item, selection and determination of a weapon or command, and the like, can be instructed. Further, the "A" button switch 38d is used, when the remote control 32 is used as a pointing device, to instruct determination of an icon or button image pointed to by a pointer (pointing image) on a game screen. For example, when an icon or button image is determined, an instruction or order (command) that is set in advance for the icon or button image can be inputted.

The "−" button 38e, the HOME button 38f, the "+" button 38g, and the power switch 38i are also press-button switches. The "−" button 38e is used to select a game mode. The HOME button 38f is used to display a game menu (menu screen). The "+" button 38g is used, for example, to start (resume) or pause a game. The power switch 38i is used to remotely turn on/off power to the game apparatus 12.

Note that, in the present embodiment, a power switch for turning on/off the remote control 32 itself is not provided and the remote control 32 is turned on by operating any of the operation means or input means 38 of the remote control 32 and is automatically turned off if there is no operation for a certain period of time (e.g., 30 seconds) or more.

The "B" button 38h is also a press-button switch and is mainly used to perform an input imitating a trigger, such as shooting a bullet, or specify a position selected by the remote control 32. When the "B" button 38h is kept pressed, the action or parameter of a player object can be maintained at a certain state. In a certain case, the "B" button 38h functions in the same manner as the normal "B" button and is used, for example, to cancel an action, command, and the like, determined by the "A" button 38d.

In the housing 36 is provided an acceleration sensor 84 (FIG. 5) that detects accelerations in three-axis (X, Y, and Z) directions (i.e., a left-right direction, an up-down direction, and a forward-backward direction) shown in FIG. 2. Note that, for the acceleration sensor 84, a two-axis acceleration sensor that detects accelerations in any two of the up-down direction, the left-right direction, and the forward-backward direction may be used according to, e.g., the shape of the housing 36 or the limitations on how the remote control 32 is held. Depending on the circumstances, a single-axis acceleration sensor may be used.

A light entrance 36b is formed at the front of the housing 36. An imaging information computing section 40 is further provided in the housing 36. The imaging information computing section 40 includes a camera that images infrared rays and a computing section that calculates coordinates, in an image, of an imaging target. The imaging information computing section 40 captures a field including the markers 30a and 30b by infrared rays to calculate position coordinates, in the field, of the markers 30a and 30b.

A connector 42 is provided at the rear of the housing 36. The connector 42 is used to connect another device to the remote control 32. In the present embodiment, a connector 50 of the gyroscope unit 34 (FIG. 3(A)) is connected to the connector 42.

At the rear of the housing 36 is also provided a pair of holes 44 at locations facing each other laterally (X-axis direction) with the connector 42 being sandwiched therebetween. Hooks 52 (FIG. 3(A)) for fixing the gyroscope unit 34 to the rear of the housing 36 are inserted into the pair of holes 44. Furthermore, at the rear of the housing 36 is provided a hole 46 for attaching a strap (not shown).

Figure 3:
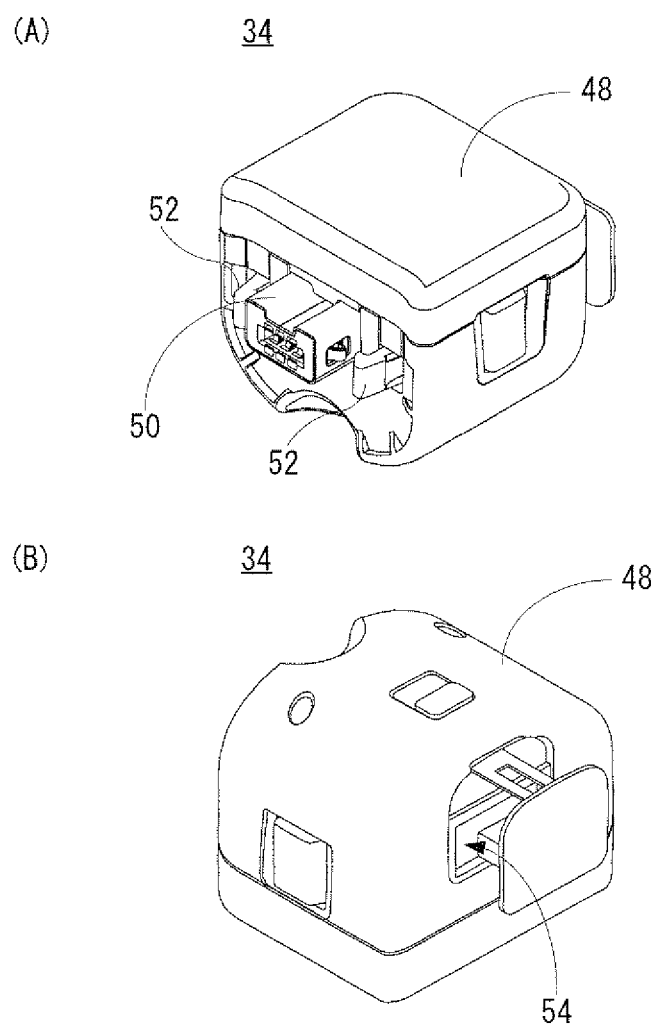
FIG. 3 is an illustrative view showing the external appearance of a gyroscope unit applied to the embodiment in FIG. 1.

FIG. 3 shows an example of the external appearance of the gyroscope unit 34. FIG. 3(A) is a perspective view of the gyroscope unit 34 as seen from the upper front and FIG. 3(B) is a perspective view of the gyroscope unit 34 as seen from the lower rear.

The gyroscope unit 34 has a housing 48 formed by, for example, plastic molding. The housing 48 has a substantially rectangular parallelepiped shape. The length of the housing 48 is about ⅓ of the length of the housing 36 of the remote control 32 and the width and thickness of the housing 48 are substantially the same as those of the housing 36. The player can perform a game operation by changing the position or orientation of the remote control 32 itself with the gyroscope unit 34 being mounted on the remote control 32.

At the front of the housing 48 is provided a connector 50. The connector 50 is engaged with the connector 42 (FIG. 2) to integrally mount the housing 48, i.e., the gyroscope unit 34, on the remote control 32. Also, at the front of the housing 48 is provided a pair of hooks 52 at locations facing each other laterally (X-axis direction) with the connector 50 being sandwiched therebetween. When the connector 50 is connected to the connector 42 to mount the gyroscope unit 34 on the remote control 32, the pair of hooks 52 is inserted into the pair of holes 44 (FIG. 2(A)) at the rear of the housing 36 and claws of the hooks 52 are hooked onto an inner wall of the housing 36. In this manner, the gyroscope unit 34 is fixed to the rear of the remote control 32.

Note that at the rear of the housing 48 of the gyroscope unit 34 is provided, if necessary, a connector 54 for mechanically and electrically mounting another expansion device on the gyroscope unit 34.

Figure 5:
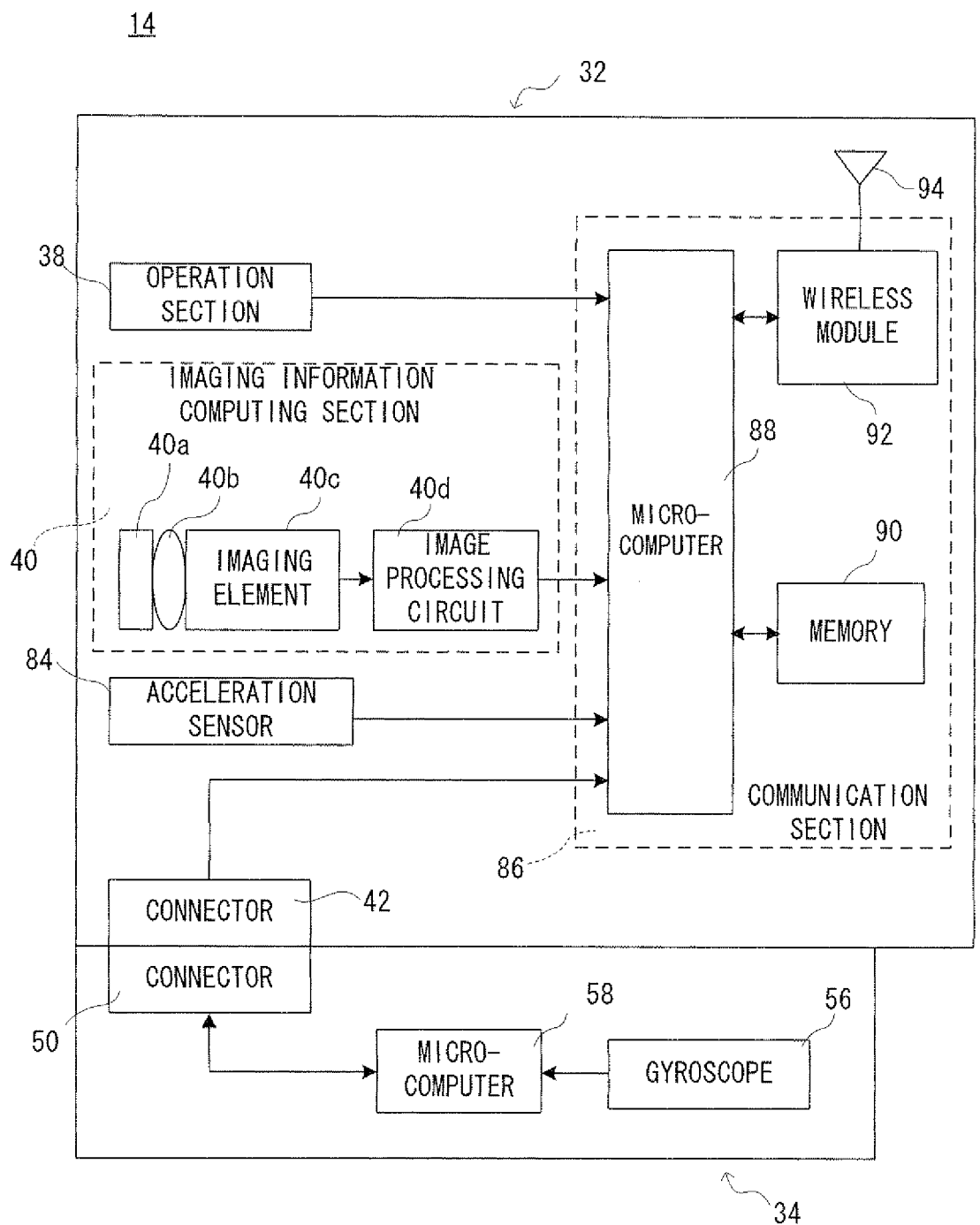
FIG. 5 is a block diagram showing an overall electrical configuration of the controller applied to the embodiment in FIG. 1.

Also, the housing 48 of the gyroscope unit 34 includes therein a gyroscope 56 and a microcomputer 58 shown in FIG. 5 that are mounted on a substrate (not shown). The gyroscope 56 generally has a two-chip configuration in which one chip detects two-axis angular velocities and the other chip detects a remaining one-axis angular velocity. Note, however, that the configuration is not limited to a two-chip configuration and the gyroscope 56 may include three single-axis gyroscopes (three chips) or one three-axis gyroscope (one chip). In any case, the position and orientation of each chip are determined such that the above-described three angular velocities can be correctly detected. The microcomputer 58 converts, as will be described later, output voltages according to respective axis angular velocities detected by the gyroscope 56 into digital data.

Power is provided to the controller 14 by batteries (provided beneath a cover 36a at the bottom of the housing 36 shown in FIG. 2) replaceably contained in the remote control 32. Power is supplied to the gyroscope unit 34 through the connectors 42 and 50.

Figure 4:
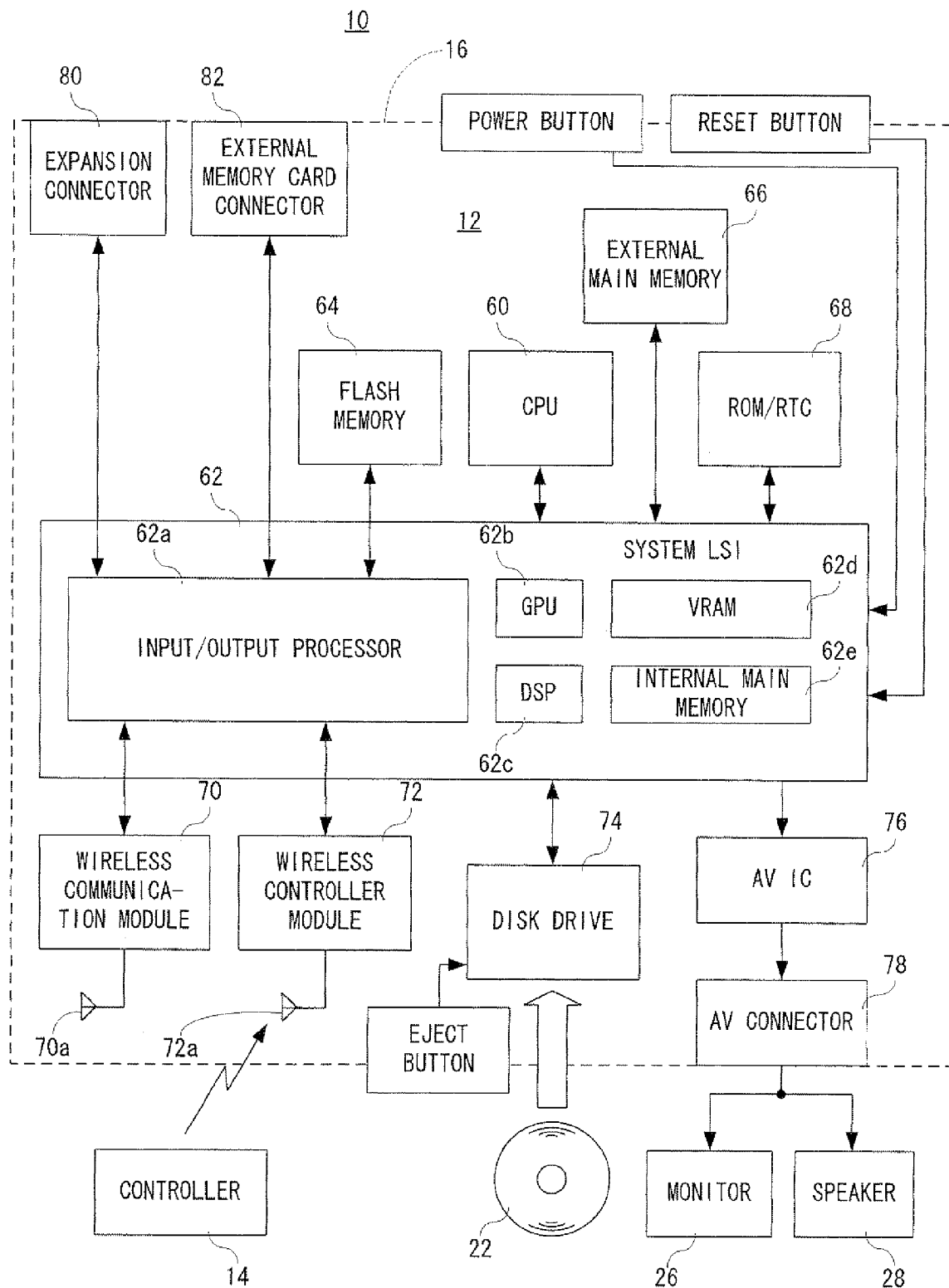
FIG. 4 is a block diagram showing an electrical configuration according to the embodiment in FIG. 1.

FIG. 4 is a block diagram showing an electrical configuration of the game system 10 according to the embodiment in FIG. 1. Although not shown, each component in the housing 16 is mounted on a printed board. As shown in FIG. 4, the game apparatus 12 is provided with a CPU 60 that functions as a game processor. To the CPU 60 is connected a system LSI 62. To the system LSI 62 are connected an external main memory 66, a ROM/RTC 68, a disk drive 74, and an AV IC 76.

The external main memory 66 stores programs such as a game program and various data and is used as a work area or buffer area of the CPU 60. The ROM/RTC 68 is a so-called boot ROM. A startup program of the game apparatus 12 is installed in the ROM/RTC 68 and a clock circuit that counts time is provided to the ROM/RTC 68. The disk drive 74 reads a program, image data, audio data, and the like, from an optical disk 22 and writes, under control of the CPU 60, the read program, data, and the like, into an internal main memory 62e, as will be described later, or the external main memory 66.

The system LSI 62 is provided with an input/output processor 62a, a GPU (Graphics Processing Unit) 62b, a DSP (Digital Signal Processor) 62c, a VRAM 62d, and an internal main memory 62e. They are, although not shown, connected to each other via an internal bus. The input/output processor (I/O processor) 62a performs data transmission and reception and downloading of data. The data transmission and reception and downloading of data will be described later.

The GPU 62b forms part of a rendering means and receives a graphics command (image generation order) from the CPU 60 and generates game image data according to the command. Note that the CPU 60 provides, in addition to the graphics command, an image generation program required to generate game image data, to the GPU 62b.

Although not shown, as described above, the VRAM 62d is connected to the GPU 62b. Data (image data: data such as polygon data and texture data) required when the GPU 62b executes an image generation command is obtained by the CPU 62b accessing the VRAM 62d. Note that the CPU 60 writes image data required for rendering into the VRAM 62d through the GPU 62b. The GPU 62b accesses the VRAM 62d to generate game image data for rendering.

Note that although the present embodiment describes the case in which the GPU 62b generates game image data, when any application other than a game application is executed, the GPU 62b generates image data for the application.

The DSP 62c functions as an audio processor and generates audio data corresponding to sound, audio, or music to be outputted from the speakers 28, using sound data or sound wave (timbre) data stored in the internal main memory 62e or the external main memory 66.

The game image data and audio data generated in the above-described manner are read by the AV IC 76 and outputted to the monitor 26 and the speakers 28 through an AV connector 78. Accordingly, a game screen is displayed on the monitor 26 and sound (music) necessary for a game is outputted from the speakers 28.

To the input/output processor 62a are connected a flash memory 64, a wireless communication module 70, and a wireless controller module 72 and are also connected an expansion connector 80 and an external memory card connector 82. To the wireless communication module 70 is connected an antenna 70a. To the wireless controller module 72 is connected an antenna 72a.

Although not shown, the input/output processor 62a can communicate with other game apparatuses and various servers connected to a network, through the wireless communication module 70. Note that communication with other game apparatuses can also be directly performed instead of through a network. The input/output processor 62a periodically accesses the flash memory 64 to detect whether there is data (referred to as "transmit data") that needs to be transmitted to the network. If there is transmit data, then the input/output processor 62a transmits the transmit data to the network through the wireless communication module 70 and the antenna 70a. Also, the input/output processor 62a receives data (referred to as "receive data") transmitted from other game apparatuses, through the network, the antenna 70a, and the wireless communication module 70 and stores the receive data in the flash memory 64. Note, however, that when receive data does not satisfy a certain condition, the receive data is discarded. The input/output processor 62a further receives data (referred to as "downloaded data") downloaded from a download server, through the network, the antenna 70a, and the wireless communication module 70 and stores the downloaded data in the flash memory 64.

Also, the input/output processor 62a receives input data transmitted from the remote control 32, through the antenna 72a and the wireless controller module 72 and (temporarily) stores the input data in a buffer area of the internal main memory 62e or the external main memory 66. The input data is used in processing (e.g., game processing) of the CPU 60 and is thereafter deleted from the buffer area.

Note that in the present embodiment, as described above, the wireless controller module 72 performs communication with the remote control 32 according to the Bluetooth standard. Hence, not only is obtained data from the controller 14 but also a predetermined order can be sent to the controller 14 from the game apparatus 12 to control the operation of the controller 14 from the game apparatus 12.

Furthermore, to the input/output processor 62a are connected the expansion connector 80 and the external memory card connector 82. The expansion connector 80 is a connector for an interface such as a USB or SCSI and can connect to a medium such as an external storage medium or connect to a peripheral device other than the remote control 32, such as a controller. Also, by connecting a wired LAN adapter to the expansion connector 80, the wired LAN can be used instead of the wireless communication module 70. To the external memory card connector 82 can be connected an external storage medium such as a memory card. Thus, for example, the input/output processor 62a can access an external storage medium through the expansion connector 80 or the external memory card connector 82 to save data or read data.

Although a detailed description is not given, when a power button is turned on, power is supplied to each component of the game apparatus 12 through an AC adapter (not shown) and the system LSI 62 is set to a mode (referred to as the "normal mode") that is a normal current-carrying state. On the other hand, when the power button is turned off, power is only supplied to some components of the game apparatus 12 and the system LSI 62 is set to a mode (hereinafter, referred to as the "standby mode") in which power consumption is kept to a minimum.

In the present embodiment, when the standby mode is set, the system LSI 62 instructs those components other than the input/output processor 62a, the flash memory 64, the external main memory 66, the ROM/RTC 68, the wireless communication module 70, and the wireless controller module 72 to stop power supply. Hence, in the present embodiment, in the standby mode, the CPU 60 does not execute any application.

Note that although power is supplied to the system LSI 62 even in the standby mode, supply of a clock to the GPU 62b, the DSP 62c, and the VRAM 62d is stopped so as not to drive them, whereby power consumption is reduced.

Although now shown, inside the housing 16 of the game apparatus 12 is provided a fan to discharge heat from ICs such as the CPU 60 and the system LSI 62 to the outside. In the standby mode, the fan is also stopped.

Note, however, that when the user does not want to use the standby mode, by making a setting not to use the standby mode, when the power button is turned off, the power supply to all circuit components is completely stopped.

Switching between the normal mode and the standby mode can be remotely performed by switching on and off the power switch 38i of the remote control 32. When this remote control is not performed, a setting may be made not to supply power to the wireless controller module 72 in the standby mode.

A reset button is also connected to the system LSI 62. When the reset button is pressed, the system LSI 62 restarts a startup program of the game apparatus 12. An eject button is connected to the disk drive 74. When the eject button is pressed, the optical disk 22 is ejected from the disk drive 74.

FIG. 5 shows an example of an overall electrical configuration of the controller 14 when the remote control 32 is connected to the gyroscope unit 34. A communication section 86 shown in FIG. 5 includes a microcomputer 88, a memory 90, a wireless module 92, and an antenna 94. The microcomputer 88 controls the wireless module 92 while using, upon processing, the memory 90 as a memory area (work area or buffer area), to transmit obtained data to the game apparatus 12 or receive data from the game apparatus 12.

Data outputted to the communication section 86 from the gyroscope unit 34 is temporarily stored in the memory 90 through the microcomputer 88. Data outputted to the communication section 86 from the operation section 38, the imaging information computing section 40, and the acceleration sensor 84 in the remote control 32 is also temporarily stored in the memory 90. When transmission timing to the game apparatus 12 arrives, the microcomputer 88 outputs data stored in the memory 90 to the wireless module 92 as controller data. The controller data includes gyro data (angular velocity data) shown in FIG. 10.

The wireless module 92 modulates a carrier wave having a predetermined frequency by the controller data, using a short-range wireless communication technique such as Bluetooth and radiates a resulting weak radio signal from the antenna 94. That is, the controller data is modulated into a weak radio signal by the wireless module 92 and the weak radio signal is transmitted from the remote control 32. The weak radio signal is received by the wireless controller module (Bluetooth communication unit) 72 on the side of the game apparatus 12. By demodulating and decoding the received weak radio signal, the game apparatus 12 can obtain the controller data. The CPU 60 of the game apparatus 12 performs game processing based on the controller data obtained from the controller 14. Note that wireless communication between the remote control 32 and the game apparatus 12 may be performed according to other standards such as a wireless LAN standard.

In the remote control 32, when the operation section 38, i.e., the aforementioned operation buttons or operation switches 38a to 38i, is operated, data representing the operation is outputted to the communication section 86. From the imaging information computing section 40 is outputted data indicating position coordinates, in the captured field, of the markers 30a and 30b to the communication section 86.

Figure 6:
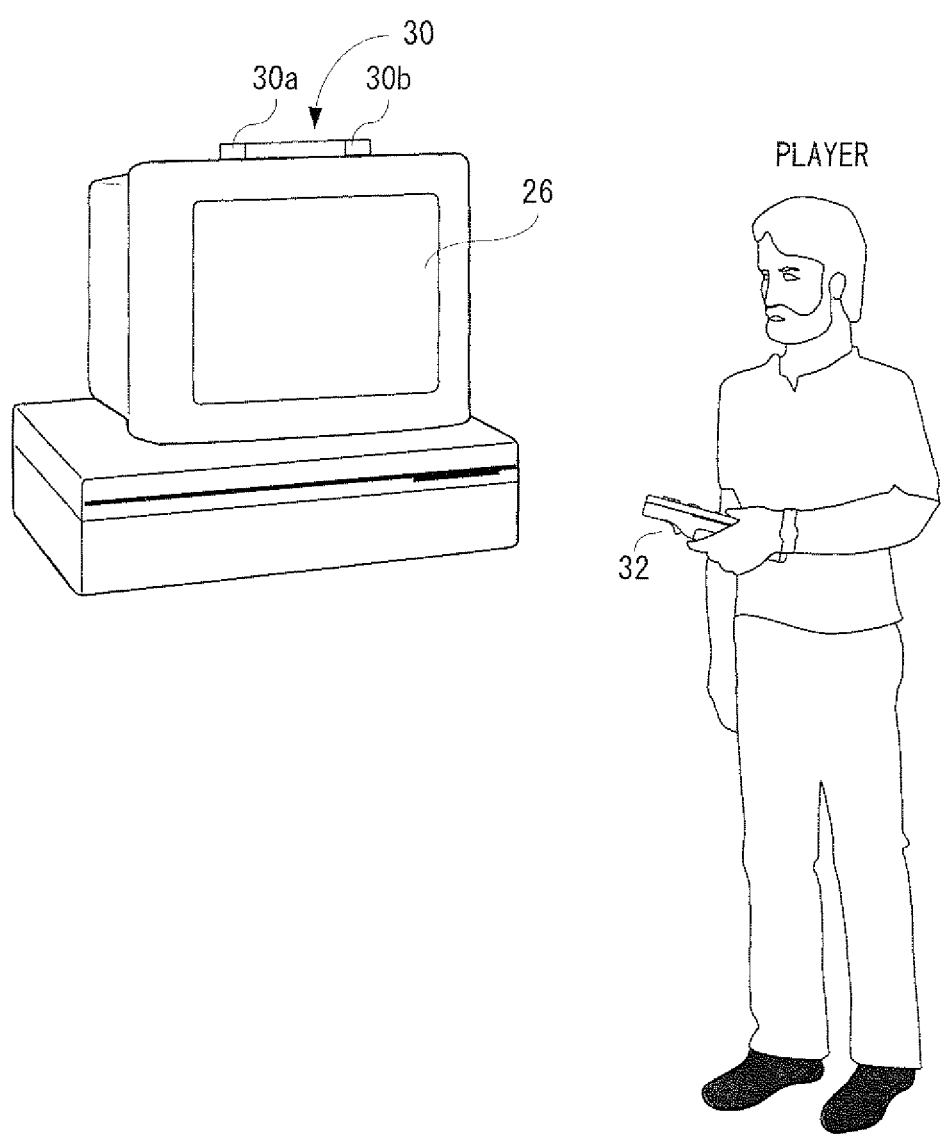
FIG. 6 is an illustrative view outlining a state when a game is played using the remote control having connected thereto the gyroscope unit shown in FIG. 1.

FIG. 6 is an illustrative view outlining a state when a game is played using the remote control 32. Note, however, that this is not limited to game play and the case in which other applications are executed or a DVD is played back is also the same. As shown in FIG. 6, when a game is played using the remote control 32 in the game system 10, a player holds the remote control 32 with his one hand. Strictly, the player holds the remote control 32 such that a tip of the remote control 32 (the side of the light entrance 36b of light imaged by the imaging information computing section 40) is pointed toward the markers 30a and 30b. Note that, as can be seen from FIG. 1, the markers 30a and 30b are disposed parallel to a lateral direction of a screen of the monitor 26. In this state, the player performs a game operation by changing the position on the screen pointed to by the remote control 32 or changing the distance between the remote control 32 and each of the markers 30a and 30b.

The imaging information computing section 40 includes an infrared filter 40a, a lens 40b, an imaging element 40c, and an image processing circuit 40d. The infrared filter 40a allows only infrared rays among lights entering from the front of the remote control 32 to pass therethrough. As described above, the markers 30a and 30b disposed near (on the periphery of) the display screen of the monitor 26 are infrared LEDs that output infrared rays toward the front of the monitor 26. Therefore, by providing the infrared filter 40a, images of the markers 30a and 30b can be imaged more accurately. The lens 40b collects infrared rays having passed through the infrared filter 40a and emits the collected infrared rays to the imaging element 40c. The imaging element 40c is a solid-state imaging element, such as a CMOS sensor or CCD, and images the infrared rays collected by the lens 40b. Thus, the imaging element 40c images only those infrared rays that have passed through the infrared filter 40a to generate image data. The image data generated by the imaging element 40c is processed by the image processing circuit 40d. The image processing circuit 40d calculates positions of imaging targets (markers 30a and 30b) in an imaged image and outputs, as marker coordinate data, coordinate values indicating the positions to the microcomputer 88 at predetermined time intervals.

Note that, although not clear in FIG. 6, the same also applies to the case in which the gyroscope unit 34 is connected to the remote control 32.

As an example, when the resolution of an imaged image that is imaged by the imaging element 40c is 126×96, marker coordinates are represented by integer values between (0,0) and (1024, 768). Outputted marker coordinate data is, as described above, included in input data by the microcomputer 88 and transmitted to the game apparatus 12.

When the game apparatus 12 (CPU 60) detects marker coordinate data from received input data, the game apparatus 12 (CPU 60) can calculate, based on the marker coordinate data, a pointing position (pointing coordinates) of the remote control 32 on a screen of the monitor 26 and distances between the remote control 32 and the markers 30a and 30b. Specifically, a position to which the remote control 32 is pointed, i.e., a pointing position, is calculated from the position of a midpoint between the two sets of marker coordinates. Also, since the distance between target images in an imaged image changes according to the distances between the remote control 32 and the markers 30a and 30b, by calculating a distance between the two sets of marker coordinates, the game apparatus 12 can grasp distances between the remote control 32 and the markers 30a and 30b.

Returning to FIG. 5, data indicating an acceleration detected by the acceleration sensor 84 is also outputted to the communication section 86. The acceleration sensor 84 has a sampling period of, for example, the order of 100 frames/second at the maximum.

To the connector 42 is connected the connector 50 of the gyroscope unit 34. The gyroscope unit 34 includes therein a gyroscope 56 and a microcomputer 58. The gyroscope 56 has, for example, the same sampling period as the acceleration sensor 84. The microcomputer 58 outputs data indicating angular velocities detected by the gyroscope 56 to the communication section 86 through the connector 50 and the connector 42.

Note that the above-described outputs to the communication section 86 are performed, for example, in a 1/200 second period. Therefore, during any period of 1/200 seconds, operation data from the operation section 38, position coordinate data from the imaging information computing section 40, acceleration data from the acceleration sensor 84, and angular velocity data from the gyroscope 56 are outputted to the communication section 86 one time each.

Figure 7:
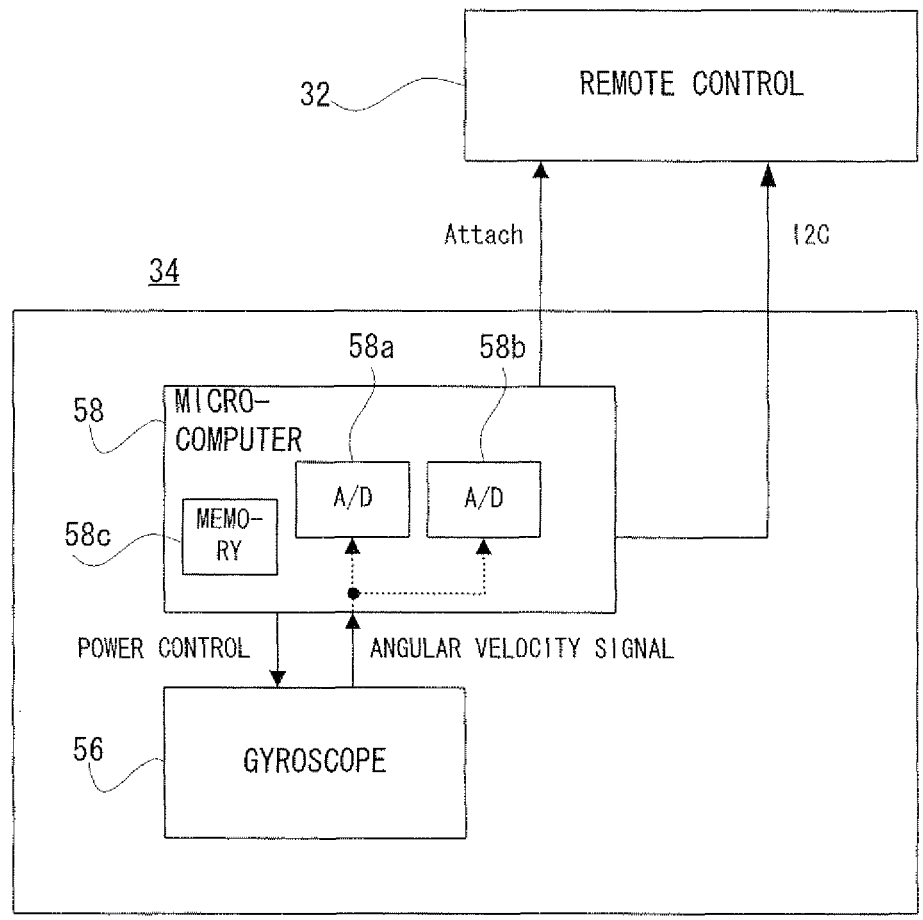
FIG. 7 is a block diagram showing an electrical configuration of the gyroscope unit connected to the remote control in the controller in FIG. 1.

FIG. 7 shows a configuration of a main part of the gyroscope unit 34 in the overall configuration shown in FIG. 5. The connector 42 and the connector 50 each are, for example, a 6-pin connector. The 6 pins include an Attach pin for controlling the variable "Attach" indicating the connection state between the connectors. The Attach changes between "Low" indicating that the connector 42 and the connector 50, i.e., the remote control 32 and the gyroscope unit 34, are disconnected from each other and "High" indicating that the connector 42 and the connector 50, i.e., the remote control 32 and the gyroscope unit 34, are connected to each other.

Figure 8:
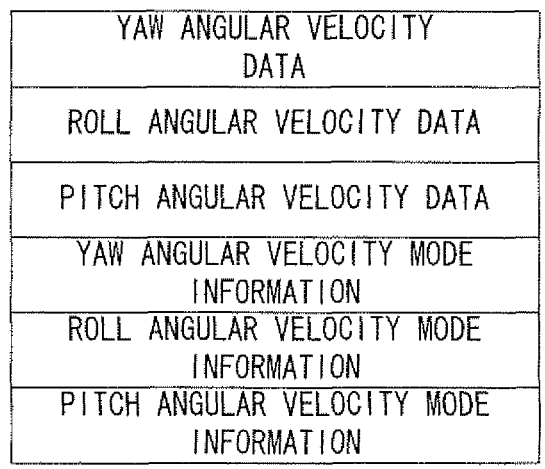
FIG. 8 is an illustrative view showing a format of data handled by the gyroscope unit.

Of the 6 pins, two pins are assigned with an I2C bus and output data (angular velocity data) from the gyroscope unit 34 shown in FIG. 8 is inputted to the remote control 32 through the I2C bus.

The microcomputer 58 of the gyroscope unit 34 includes A/D conversion circuits 58a and 58b. Angular velocity signals about three axes to be outputted from the gyroscope 56 are provided to each of the A/D conversion circuits 58a and 58b. The A/D conversion circuit 58a performs an A/D conversion process in a high angular velocity mode that targets all of a detection range of the gyroscope 56 (e.g., ±360 degrees/second). The A/D conversion circuit 58b performs an A/D conversion process in a low angular velocity mode that targets part of the detection range of the gyroscope 56 (e.g., ±90 degrees/second). The microcomputer 58 outputs one of the two types of A/D conversion results as angular velocity data.

Specifically, when two types of angular velocity data obtained at a certain time are outputted from the A/D conversion circuits 58a and 58b, the microcomputer 58 first determines for each axis, i.e., each of yaw, roll, and pitch, whether a value A of one of the angular velocity data that is angular velocity data in the low angular velocity mode is within a range from a first threshold value Th1 to a second threshold value Th2 (>Th1), i.e., whether the condition "Th1≤A≤Th2" is satisfied. Then, based on the three determination results, one of the low angular velocity mode and the high angular velocity mode is selected. For example, for each of the three determination results, if YES is obtained then the low angular velocity mode is selected for each axis, and if NO, then the high angular velocity mode is selected for each axis. Then, the angular velocity data units according to their respective modes selected for each axis are each outputted together with mode information indicating the selected mode. In short, by changing the accuracy of data according to the angular velocity, even when the amount of data is the same, data with higher accuracy can be outputted when at low speed.

Figure 9:
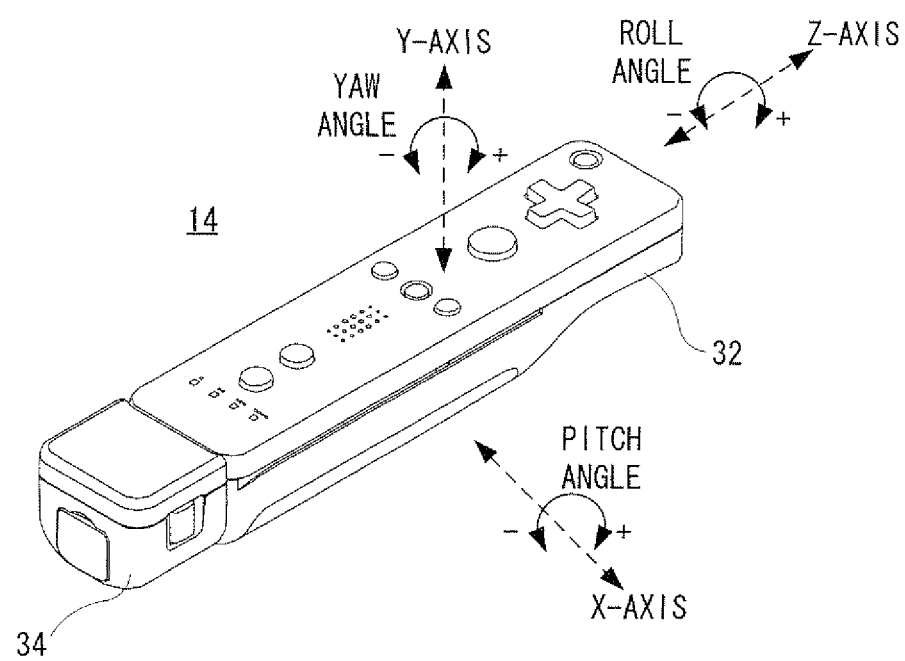
FIG. 9 is an illustrative view showing a yaw angle, a pitch angle, and a roll angle that can be detected by a gyroscope.

FIG. 8 shows a format of data handled by the gyroscope unit 34. Data for the gyroscope unit 34 includes yaw angular velocity data, roll angular velocity data, pitch angular velocity data, yaw angular velocity mode information, roll angular velocity mode information, and pitch angular velocity mode information. Note that, as shown in FIG. 9, a y-axis rotation is represented by a yaw angle, an x-axis rotation is represented by a pitch angle, and a z-axis rotation is represented by a roll angle.

Each of the yaw angular velocity data, the roll angular velocity data, and the pitch angular velocity data is, for example, 14-bit data obtained by A/D converting a corresponding one of a yaw angular velocity signal, a roll angular velocity signal, and a pitch angular velocity signal outputted from the gyroscope 56. Each of the yaw angular velocity mode information, the roll angular velocity mode information, and the pitch angular velocity mode information is one-hit information indicating a mode of corresponding angular velocity data, and changes between "0" corresponding to the high angular velocity mode and "1" corresponding to the low angular velocity mode.

The gyroscope unit 34 outputs gyro data according to the format shown in FIG. 8 to the communication section 86 in, for example, a 1/100 second period. This is sufficiently shorter than a 1/60 second period that is a general processing period for game processing and the like, and thus the data can be fully used in game processing.

Gyro data such as that shown in FIG. 8 is transmitted from the remote control 32 to the game apparatus 12 as angular velocity data "data", as will be described later.

In the game system 10, an input to an application such as a game can be performed not only by a button operation but also by moving the controller 14 itself. When a game is played, the acceleration sensor 84 that detects accelerations in three-axis directions is built in the remote control 32 and when the gyroscope unit 34 is mounted on the remote control 32, angular velocities about three axes indicating a movement of the remote control 32 itself are further detected.

These detected values are transmitted to the game apparatus 12 in the aforementioned controller data form. In the game apparatus 12 (FIG. 4), the controller data from the controller 14 is received by the input/output processor 62a through the antenna 72a and the wireless controller module 72 and the received controller data is written into a buffer area of the internal main memory 62e or the external main memory 66.

The CPU 44 reads the controller data stored in the buffer area of the internal main memory 62e or the external main memory 66 and reconstructs the detected values, i.e., the values of accelerations and/or angular velocities detected by the controller 14, from the controller data.

Note that since angular velocity data has two modes, i.e., high angular velocity and low angular velocity modes, two types of angular velocity reconstruction algorithms respectively for the two modes are prepared. When the value of angular velocity is reconstructed from angular velocity data, an angular velocity reconstruction algorithm appropriate for the mode of the angular velocity data is selected based on angular velocity mode information.

The CPU 60 may perform, in parallel with such a reconstruction process, a process of computing a velocity of the controller 14 from reconstructed accelerations. Furthermore, in parallel with this, the moving distance or position of the controller 14 can also be obtained from the computed velocity. On the other hand, from reconstructed angular velocities, a rotation angle of the controller 14 can be obtained. Note that an initial value (integral constant) used when a velocity is obtained by adding up accelerations or a rotation angle is obtained by adding up angular velocities may be computed based on, for example, position coordinate data from the imaging information computing section 40. The position coordinate data may also be used to modify error accumulated by adding up.

Game processing is performed based on variables obtained in the above-described manner, such as accelerations, a velocity, a moving distance, angular velocities, and a rotation angle. Therefore, it is not necessary to perform all of the above-described processes and only those variables that are required for game processing are appropriately calculated. Note that angular velocities and a rotation angle can also be computed from accelerations in principle but doing so requires a complex routine for a game program, imposing a heavy processing load on the CPU 60. By using the gyroscope unit 34, program development is facilitated and also the processing load of the CPU 60 is reduced.

Figure 10:
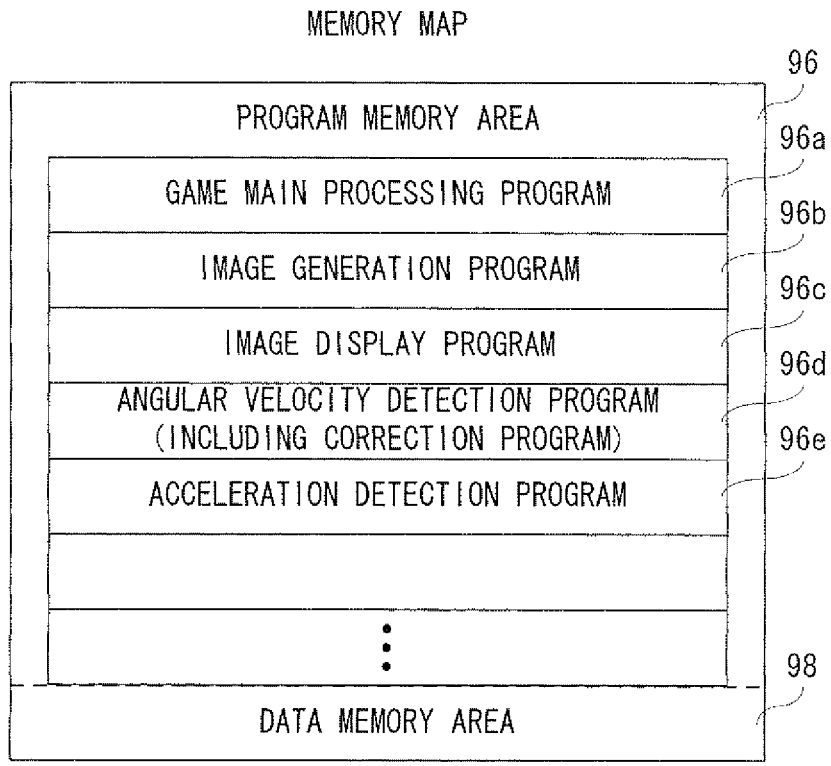
FIG. 10 is an illustrative view showing a memory map of a main memory shown in FIG. 4.
Figure 11:
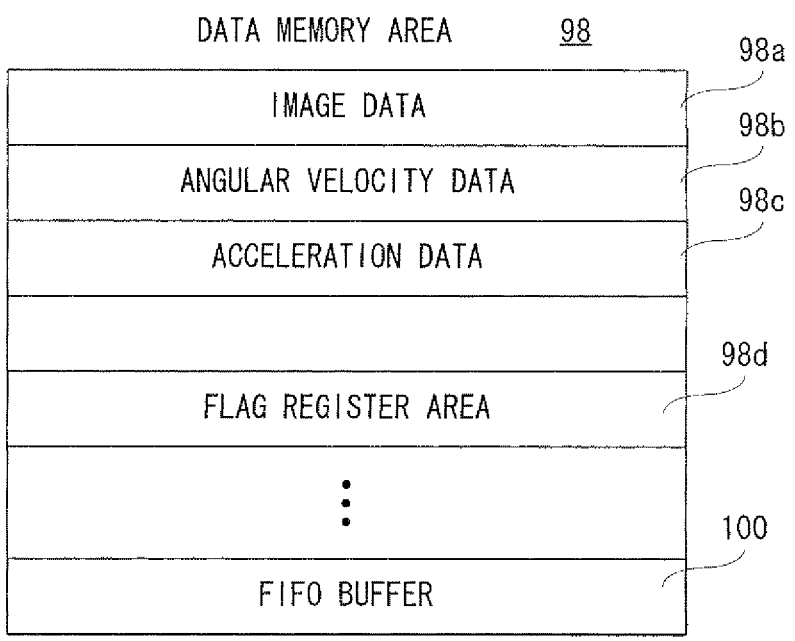
FIG. 11 is an illustrative view showing a specific example of a data memory area shown in FIG. 10.

FIG. 10 is an illustrative view showing a memory map of the internal main memory 62e or the external main memory 66 shown in FIG. 4. As shown in FIG. 10, the main memory (62e or 66) includes a program memory area 96 and a data memory area 98. Note that specific contents of the data memory area 98 are shown in FIG. 11.

The program memory area 96 stores a game program and the game program includes a game main processing program 96a, an image generation program 96b, an image display program 96c, an angular velocity detection program 96d, an acceleration detection program 96e, and the like.

The game main processing program 96a is a program for processing a main routine of a virtual game according to the present embodiment. The image generation program 96b is a program for generating a game image to display a game screen on the monitor 26, using image data 98a (see FIG. 11), as will be described later. The image display program 96c is a program for displaying the game image generated according to the image generation program 96b, on the monitor 26 as a game screen.

The angular velocity detection program 96d is a program for detecting angular velocity data concerning angular velocities detected by the gyroscope 56. Since, as described above, angular velocity data is included in input data from the remote control 32, the CPU 60 detects angular velocity data included in input data from the remote control 32, according to the angular velocity detection program 96d. Note that the angular velocity detection program 96d includes a correction program shown in FIG. 14, as will be described later.

The acceleration detection program 96e is a program for detecting acceleration data concerning accelerations detected by the acceleration sensor 84. Since, as described above, acceleration data is included in input data from the remote control 32, the CPU 60 detects one or two acceleration data units included in input data from the remote control 32, according to the acceleration detection program 96e.

Note that, although not shown, the game program also includes a sound output program, a backup program, and the like. The sound output program is a program for outputting, using sound (music) data, sound required for a game, such as music (background music), voice or onomatopoeic sound of an object, and sound effects. The backup program is a program for saving game data (midway data and result data) in a memory card.

As shown in FIG. 11, the data memory area 98 temporarily stores various data such as image data 98a, angular velocity data 98b, and acceleration data 98c. Also, in the data memory area 98, a flag register area 98d for a timer, a register, and further a necessary flag, a FIFO (First-In First-Out) buffer 100, and the like, are appropriately provided.

The image data 98a is image data for generating a game image and includes object image data of a player object, a non-player object, and the Like, and further includes polygon data, texture data, and the like. The angular velocity data 98b is angular velocity data obtained through detection according to the angular velocity detection program 96d and correction according to the correction program. Note that in the present embodiment three or four angular velocity data units are detected for each frame. The acceleration data 98c is acceleration data of the remote control 32 detected according to the acceleration detection program 96e. Although angular velocity and acceleration data are used to calculate a posture for each frame, such a number of (e.g., 20) angular velocity and acceleration data that corresponds to a plurality of frame periods may be stored for the purpose of, e.g., correction.

Figure 12:
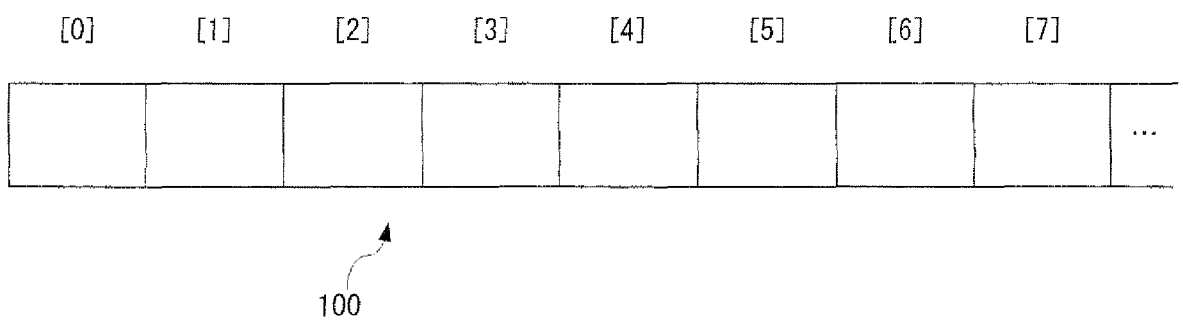
FIG. 12 is an illustrative view showing an example of a FIFO buffer.

In the data memory area 98 is formed the FIFO buffer 100, a detail of which is shown in FIG. 12. The FIFO buffer 100 includes a plurality of stages of data buffers connected in series and each stage (memory location) is specified by a buffer index idx. In the data buffers are stored digital data such as angular velocity data and acceleration data.

A process according to the present embodiment performed by the CPU 60 shown in FIG. 4 will be described with reference to FIGS. 13 and 14. In a first step S1 of a game main process shown in FIG. 13, a modification offset value ofs set in the flag register area 98d in the data memory area 98 shown in FIG. 11 is initialized. The modification offset value ofs is an offset value (zero-point offset value) used for correction to eliminate (reduce) a difference occurred, due to a temperature drift and the like, between digital integer value data associated with an analog value indicating that an angular velocity outputted from the gyroscope 56 is zero and digital integer value data obtained by converting an analog value actually indicating that the velocity is zero. An initial value (device's unique value) stored upon the initialization is, for example, unique to each individual gyroscope 56 included in the gyroscope unit 34 and is set at factory shipment of the gyroscope 56. Each individual sets an initial value unique to a device thereof, as a modification offset value ofs. For example, a value measured at 25° C. at the factory is an initial value. The value may be renewable by a predetermined method after factory shipment.

In a subsequent step S3, the CPU 60 initializes a buffer index idx for specifying a data buffer of the FIFO buffer 100. As an example, "0" is set for the buffer index idx. Note, however, that the initial value may be any value in a range from "0" to "BUFS-1". As used herein, the "BUFS" refers to a numerical value indicating the size of the FIFO buffer 100 and is stored, for example, in the flag register area 98d as a buffer capacity BUFS. For example, in the case of the FIFO buffer 100 of a size whose buffer capacity BUFS is set as "400", the initial value of the buffer index idx is set in a range from "0" to "399 (400−1)".

Thereafter, in a step S5, the internal FIFO buffer 100 is initialized. For example, a value such as "−100" is set that is sufficiently far from a value obtained by subtracting a constant C1 (e.g., "1") from a range of values obtained from the gyroscope 56 (buf[0−(BUFS−1)]→−100).

Figure 14:
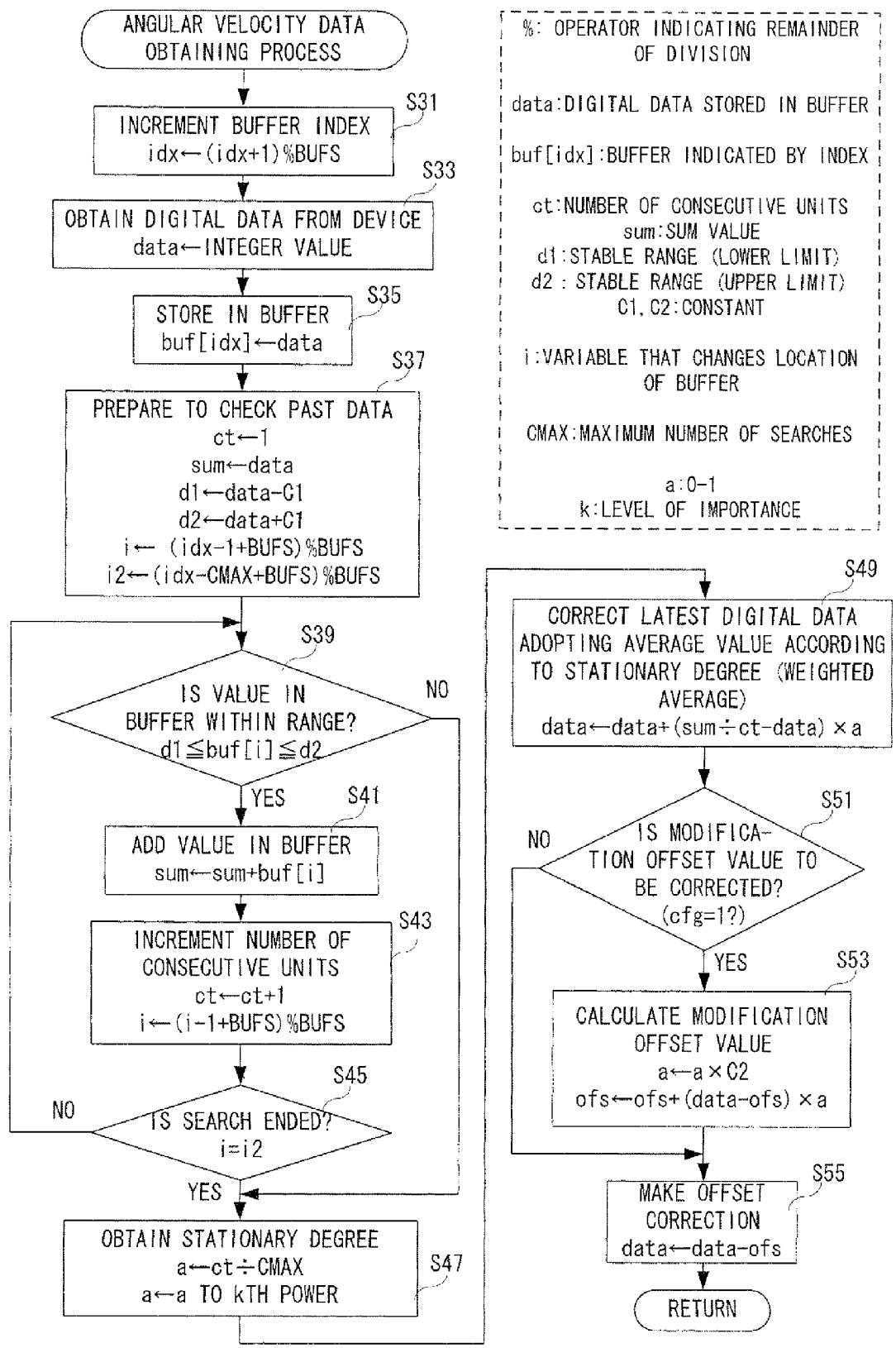
FIG. 14 is a flowchart showing operations of an angular velocity data obtaining process shown in FIG. 13.

Then, in a step S7, angular velocity data is obtained according to an angular velocity data obtaining process shown in FIG. 14.

Thereafter, in a step S11, during game processing, the CPU 60 determines whether it is a scene where there is a possibility of performing an operation of moving the remote control 32, i.e., the gyroscope unit 34, with constant velocity. For example, in a shooting game, when a target is aimed with a gun loaded with bullets or a bow fixed with an arrow, the player performs an operation of slowly moving the muzzle of the gun or the arrow, for example, from the left to the right. When performing an operation of aiming with the muzzle of the gun or the arrow using the remote control 32, the remote control 32 is slowly moved in the real space. In that case, there is a possibility that the remote control 32, i.e., the gyroscope unit 34, is operated with a constant velocity in the real space. In the step S11, it is determined whether the current scene is a scene where there is a possibility of performing such a constant velocity operation. This determination may be made by a flag set in advance on a scene-by-scene basis in a game or may be made by an input mode of the remote control 32 or may be made by input data from the remote control 32 or may be made by any other condition as long as a constant velocity operation of the remote control 32 can be determined.

If "YES" in the step S11, then the CPU 60 sets, in a step S13, an offset correction flag cfg to 0 and proceeds to a step S15. If "NO" in the step S11, then the CPU 60 sets, in a step S14, the offset correction flag cfg to 1 and proceeds to the step S15. The offset correction flag cfg is a flag indicating whether the modification offset value ofs needs to be corrected. When the modification offset value ofs need not be corrected (when there is a possibility of performing a constant velocity operation), 0 is set, and when the modification offset value ofs needs to be corrected (when there is no possibility of performing a constant velocity operation), 1 is set.

Then, in the step S15, it is determined whether the game is ended. For example, when "game over" is reached or the player operates the remote control 32 to end the game, the step S15 is "YES" and the game is ended. If "NO" in the step S15, then processing returns to the previous step S7 to continuously perform obtaining of angular velocity data, game processing, and the like.

The angular velocity data obtaining process in the previous step S7 will be described in detail with reference to FIG. 14. It is to be understood, however, that although FIG. 14 only shows an angular velocity obtaining process for one axis, if, as shown in FIG. 9, a plurality of axes are set, then the same process is performed for all the axes.

In a first step S31 in FIG. 14, the CPU 60 increments the buffer index idx (idx←(idx+1)%BUFS) where the symbol "%" represents an operator indicating a remainder and modulo arithmetic is performed. For example, when the process is performed with the FIFO buffer 100 of a size whose buffer capacity BUFS is set as "400", the buffer index idx is updated (incremented) by 1 in the range from "0" to "399". Note, however, that by performing modulo arithmetic, "399" is updated to "0". The reason why the buffer index idx is thus updated using a remainder is that an update process of the buffer index idx is efficiently performed that is performed to systematically and efficiently use a plurality of stages of data buffers connected in series and included in the FIFO buffer 100 that is a loop buffer whose capacity is predetermined.

In a next step S33, the CPU 60 obtains angular velocity data (integer value) from the controller 14, i.e., the remote control 32, received by the input/output processor 62a and stores the obtained angular velocity data in the angular velocity data "data" included in the flag register area 98d (FIG. 11).

In a subsequent step S35, the CPU 60 stores the angular velocity data (the latest angular velocity data) stored in the angular velocity data "data" in a data buffer of the FIFO buffer 100 indicated by the buffer index idx incremented in the step S31 (buf[idx]←data).

In a next step S37, the CPU 60 prepares to check past data. Specifically, in the present embodiment, in the step S37, preparation (initialization or setting of variables and counters) is performed for a comparison process between the angular velocity data (the latest angular velocity data) stored in the angular velocity data "data" and past angular velocity data (angular velocity data stored in data buffers of the FIFO buffer 100). The comparison process is performed to correct the angular velocity data obtained from the controller 14, i.e., the remote control 32, and correct a deviation of the modification offset value ofs of the gyroscope 56.

The CPU 60 first sets a number of consecutive units ct formed in the flag register area 98d to "1". The number of consecutive units ct is a counter for counting the number of consecutive units and a value indicated by the number of consecutive units ct indicates how many times a data buffer having a value that satisfies a certain condition (described later) (step S39) is consecutively detected. In a sum value sum similarly formed in the flag register area 98d is stored the angular velocity data written into the angular velocity data "data" in the step S33. That is, the angular velocity data written, as an initial state, into the angular velocity data "data" in the step S33 is stored in the sum value sum. Then, using a constant C1, a stable range (lower limit) d1 and a stable range (upper limit) d2 (both are formed in the flag register area 98d) are set. Specifically, the stable range (lower limit) d1 is set to a lower limit value data−C1 and the stable range (upper limit) d2 is set to an upper limit value data+C1. Note that by a lower limit value and an upper limit value respectively set for the stable range (lower limit) d1 and the stable range (upper limit) d2, a range with equal upper and lower bounds with the angular velocity data "data" written in the previous step S33 being the center (with upper and lower widths each corresponding to C1) is set. In another example, the constant C1 may be a variable and may be changed according to angular velocity data "data", the number of consecutive units ct, and the like, or may be changed depending on other circumstances.

A variable i in the step S37 is a value for specifying a location of a data buffer that is checked retrogressively from the data buffer of the FIFO buffer 100 indicated by the buffer index idx, into which data buffer the angular velocity data is written in the step S35, and is set in the flag register area 98d. Then, the variable i is shifted in a direction in which the variable i is decremented by "1" ((idx−1+BUFS)%BUFS) to check a value in a data buffer specified by the variable. When the variable i reaches a variable i2, the retrogressive search is ended. Note that the variable i2 is represented by (idx−CMAX+BUFS) % BUFS where a numerical value indicated by the maximum number of searches CMAX indicates how many data units at the maximum the retrogressive check is performed on. More specifically, when a number of searches corresponding to the maximum number of searches CMAX have been performed, a value indicating a location to which the variable i is shifted turns to the variable i2. Therefore, the buffer capacity BUFS needs to be larger than the maximum number of searches CMAX (BUFS≥CMAX). For example, the maximum number of searches CMAX is set such that CMAX=400. The reason why the variable i and the variable i2 are thus set using a remainder is the same as that for using a remainder when the buffer index idx is updated. The reason why the buffer capacity BUFS is added (+BUFS) when the variable i is set is that, when the buffer index idx is 0, "idx−1" becomes negative (−), and if modulo arithmetic is performed on a negative value, a correct computation result cannot be obtained.

In subsequent steps S39 to S45, a comparison process is performed between the angular velocity data (the latest angular velocity data) stored in the angular velocity data "data" and past angular velocity data (angular velocity data stored in data buffers of the FIFO buffer 100). First, in a step S39, the CPU 60 determines whether a value in a data buffer specified by the variable i incremented in the step S37 is within the stable range set by the stable range (lower limit) d1 and the stable range (upper limit) d2 (d1≤buf[i]≤d2). If "YES" in the step S39, i.e., if the value in the data buffer specified by the variable i is included in the stable range set by the stable range (lower limit) d1 and the stable range (upper limit) d2 (the value is close to the angular velocity data "data"), then in a subsequent step S41 the value included in the stable range, i.e., the value in the data buffer specified by the variable i, is added to the sum value sum. That is, when the value in the data buffer specified by the variable i satisfies the stable range condition (the value is included in the stable range set by the stable range (lower limit) d1 and the stable range (upper limit) d2), the sum value is updated using the value in the data buffer. Thereafter, in a step S43, the number of consecutive units ct is incremented. In this manner, the number of data buffers consecutively satisfying the stable range condition is counted by the number of consecutive units ct. Furthermore, in the step S43, the variable i is shifted in the direction in which the variable i is decremented by "1" and is thereby updated (I←(i−1+BUFS)%BUFS). The reason why the buffer capacity BUFS is added (+BUFS) when the variable i is updated is the same as that for setting the variable i in the step S37. Then, in a step S45, it is determined whether a number of searches corresponding to the maximum number of searches CMAX have been performed. Specifically, the variable i is updated and it is determined whether the variable i has reached the variable i2. If a number of searches corresponding to the maximum number of searches CMAX have been performed, then it is "YES" and processing proceeds to a step S47. On the other hand, if a number of searches corresponding to the maximum number of searches CMAX have not been performed, then it is "NO" and in that case processing returns to the previous step S39 to continue a search.

On the other hand, if "NO" in the step S39, it indicates that a value outside the stable range set by the stable range (lower limit) d1 and the stable range (upper limit) d2 is detected in a data buffer before a number of searches corresponding to the maximum number of searches CMAX are performed, which in other words indicates that a movement with a large velocity change is provided to the remote control 32, i.e., the gyroscope unit 34 (abruptly moved). In this case, processing proceeds from the step S39 to the step S47.

By repeating the step S39 to the step S45, the number of data buffers having been determined to be consecutively included in the stable range set by the stable range (lower limit) d1 and the stable range (upper limit) d2 retrogressively from the data buffer having stored therein the angular velocity data "data", is stored in the number of consecutive units ct and a sum value of values in the data buffers is stored in the sum value sum. That is, data buffers consecutively included in the stable range (d1≤buf[i]≤d2) retrogressively from the location of the data buffer into which the angular velocity data is written in the step S35 in order from newest to oldest data buffers are repeatedly obtained and a number of the data buffers (the number of consecutive units ct) and a sum value (sum value sum) are calculated (note that the upper limit number of searches is the maximum number of searches CMAX).

After "NO" in the step S39 or "YES" in the step S45, in the step S47 the CPU 60 obtains a stationary degree value (stationary level) "a" of the remote control 32, i.e., the gyroscope unit 34, at that time. The stationary degree value "a" is a numerical value in a range from "0" to "1" and is normalized such that the longer the period during which a change in the movement of the remote control 32, i.e., the gyroscope unit 34, is small (stable), the closer the stationary degree value is to "1" and when the number of consecutive units counted by the number of consecutive units ct is equal to the maximum number of searches CMAX (when ct=CMAX), i.e., when values in a number of data buffers corresponding to the maximum number of searches CMAX that are consecutively arranged retrogressively from the data buffer having stored therein the angular velocity data "data" are all included in the range set by the stable range (lower limit) d1 and the stable range (upper limit) d2 (when "YES" in the step S45), the stationary degree value "a" is the maximum value "1".

Specifically, the stationary degree value "a" is determined by a ratio of the number of consecutive units ct to the maximum number of searches CMAX (ct÷CMAX). For example, in the case of the maximum number of searches CMAX being 400, when the step S39 branches to "NO" with the 399th data (ct=399), the stationary degree value "a" is $399/400$. In the case of the maximum number of searches CMAX being 400, when the step S39 branches to "NO" with the first data (ct=1), the stationary degree value "a" is $1/400$. That is, the stationary degree value "a" is an index indicating how far back the values in data buffers are consecutively included (stable) in the predetermined stable range retrogressively from the data buffer having stored therein the angular velocity data "data".

By further raising to the kth power (k≥1) (ak), the difference between when a state with a small change lasts long, i.e., when the number of times the determination in the step S39 is "YES" (the value of the number of consecutive units ct) is large, and when small is made large. That is, when the stationary degree value "a" is used as it is, it is only proportional to the number of consecutive units ct. However, by raising to a power, e.g., the kth power, a setting can be made such that the stationary degree value "a" exponentially changes with respect to the number of consecutive units ct. Accordingly, when a process using the number of consecutive units ct is performed, the difference between when the number of consecutive units ct is large and when small can be exhibited distinctly. In the embodiment, k is set to 32. Note, however, that when the stationary degree value "a" is a value proportional to the number of consecutive units ct, too, such as when k=1, it can be implemented. Furthermore, in another example, k may be a variable and may be changed according to angular velocity data "data", the number of consecutive units ct, and the like, or may be changed depending on other circumstances.

Then, in a step S49, the CPU 60 corrects the angular velocity data "data" using an average value according to the stationary degree value "a" (data←data÷(sum÷ct−data)×a). Specifically, the sum value stored in the sum value sum is divided by the number of consecutive units ct, the angular velocity data "data" is subtracted from the resulting quotient, the resultant is multiplied by the stationary degree value "a", and the resultant is added to the angular velocity data "data", which in other words, indicates that weighting as to whether the angular velocity data "data" is adopted or the average value (sum÷ct) is adopted is determined according to the value of the stationary degree value "a". Hence, a weighted average value of the average value and the angular velocity data "data" is calculated such that the larger the stationary degree value "a" the heavier the weight of the average value (the greater the influence of the average value). Also, a weighted average value of the average value and the angular velocity data "data" is calculated such that the smaller the stationary degree value "a" the heavier the weight of the angular velocity data "data" (the greater the influence of the angular velocity data "data"). By the calculated weighted average value, the angular velocity data "data" is corrected. That is, the larger the stationary degree value "a", i.e., the longer the period during which a change in the movement of the remote control 32, i.e., the gyroscope unit 34, is small (stable), the heavier the weight of the average value (the greater the influence of the average value), and thus, the angular velocity data "data" is corrected to a highly accurate, highly reliable, and smooth value with a reduced deviation. Also, the smaller the stationary degree value "a", i.e., when a movement with a large change (large velocity change) is provided to the remote control 32, i.e., the gyroscope unit 34, the heavier the weight of the angular velocity data "data" (the greater the influence of the angular velocity data "data"), and thus, the angular velocity data "data" is corrected to a value with high trackability (excellent response) that promptly reflects a movement with a large change.

Note, however, that although, in the step S49, by performing the above-described computation the angular velocity data "data" is overwritten and corrected, the angular velocity data "data" may be left as it is without being updated and corrected data may be separately outputted. Thus, when used with, e.g., a connector, the angular velocity data "data" that is corrected in the step S49 may be separately outputted. As such, by separately outputting, the angular velocity data "data" can be used for another purpose.

Also, although, in the step S49, weighting is performed using the stationary degree value "a", since only those data buffers that are determined in the step S39 to be consecutively included in the stable range set by the stable range (lower limit) d1 and the stable range (upper limit) d2 retrogressively from the data buffer having stored therein the angular velocity data "data" influence the number of consecutive units ct and the sum value sum and data obtained when a movement with a large change is performed is less likely to exert an influence, by setting the stationary degree value "a" to 1 at all times, i.e., by substituting an average value (sum÷ct) into the angular velocity data "data", the angular velocity data "data" may be corrected. Furthermore, a predetermined threshold value may be provided to the stationary degree value "a" and only when the stationary degree value "a" exceeds the predetermined threshold value, a correction in the step S49 may be made, or on the contrary, only when the stationary degree value "a" falls below the predetermined threshold value, a correction in the step S49 may be made.

As such, in the present embodiment, since, based on weighting according to the consecutive level (stationary degree value "a") of data buffers that are included in a range (stable range) indicated by a stable range (lower limit) d1 and a stable range (upper limit) d2 and set for obtained angular velocity data "data", a weighted average of the angular velocity data "data" and average value data is calculated. Thus, when the consecutive level (stationary degree value "a") is high, the average value data is adopted with a heavy weight (the influence of the average value is great) and thus highly accurate, highly reliable, and smooth angular velocity data "data" with a reduced deviation is obtained. In contrast, when the consecutive level (stationary degree value "a") is low, the angular velocity data "data" is adopted with a heavy weight (the influence of the angular velocity data "data" is great) and thus, for example, when an abrupt change is occurring, the angular velocity data "data" is corrected so as to promptly reflect the change and thus angular velocity data "data" with high trackability (excellent response) that promptly reflects a movement with a large change is obtained.

That is, by such a process, when a change in the movement of the remote control 32, i.e., the gyroscope unit 34, is small (stable), highly accurate, highly reliable, and smooth digital data (output data) with a reduced deviation is obtained; on the other band, when a quick reaction is required while performing a smoothing process to slow down a reaction, digital data (output data) with high trackability (excellent response) that promptly reflects a movement with a large change is obtained. Accordingly, antinomic requests can be effectively met.

Furthermore, by correcting the modification offset value ofs used as a zero-point offset for an angular velocity outputted form the gyroscope 56, to be closer to the angular velocity data "data" corrected in the step S49, as the stationary degree value "a" becomes larger (as the period during which a change in the movement of the remote control 32, i.e., the gyroscope unit 34, is small (stable) becomes longer), a zero-point deviation due to a temperature drift can be reduced.

First, in a step S51, it is determined whether the modification offset value ofs is to be corrected. Specifically, the determination is made based on the offset correction flag cfg that is set (reset) in the step S13 or S14 in FIG. 13 based on the result of the determination in the step S11 in FIG. 13 made during game processing as to whether it is a scene where there is a possibility of performing an operation of moving the remote control 32, i.e., the gyroscope unit 34, with a constant velocity. When the offset correction flag cfg is 1, i.e., when the step S11 in FIG. 13 branches to "NO" and the offset correction flag cfg is set to 1 in the step S14 and thus there is no possibility of performing an operation of moving the remote control 32, i.e., the gyroscope unit 34, with a constant velocity, in a step S53 the modification offset value ofs is corrected. On the other hand, when the offset correction flag cfg is 0, i.e., the step S11 in FIG. 13 branches to "YES" and the offset correction flag cfg is set to 0 in the step S13 and thus there is a possibility of performing an operation of moving the remote control 32, i.e., the gyroscope unit 34, with a constant velocity, without correcting the modification offset value ofs, processing proceeds to a step S55.

In the step S53, since it can be said that the larger the stationary degree value "a" (the longer the period during which a change in the movement of the remote control 32, i.e., the gyroscope unit 34, is small (stable)) the smaller (the more stable) the change in the movement of the remote control 32, i.e., the gyroscope unit 34, a level of a correction made such that the angular velocity data "data" corrected in the step S49 is angular velocity data (zero point) for a controller's stationary state is calculated according to the magnitude of the stationary degree value "a" and the offset value (modification offset value ofs) is corrected according to the level.

Specifically, by multiplying the stationary degree value "a" by a constant C2, the stationary degree value "a" is changed. The constant C2 is set, for example, to "0.01" and the stationary degree value "a" is changed to 0.01×a. The reason why the stationary degree value "a" is changed to a smaller value by multiplying the stationary degree value "a" by the constant C2 is that if the stationary degree value "a" calculated in the step S47 is used as it is, the angular velocity data "data" is corrected in a short period of time to angular velocity data (zero point) for a controller's stationary state, making it difficult to obtain a value of the angular velocity data "data". Also, the phenomenon "temperature drift" that causes a zero-point deviation is not a phenomenon with a rapid change and thus this correction need not be made with fast response. In another example, the constant C2 may be a variable and may be changed according to angular velocity data "data", the number of consecutive units ct, and the like, or may be changed depending on other circumstances. Then, by using the changed stationary degree value "a", the modification offset value ofs is corrected. Specifically, a result obtained by subtracting the modification offset value ofs from the angular velocity data "data" corrected in the step S49 is multiplied by the stationary degree value "a" changed by being multiplied by the constant C2 and a resulting value is added to the modification offset value ofs. Hence, according to the stationary degree value "a", a difference between the angular velocity data "data" corrected in the step S49 and the modification offset value ofs is added to the modification offset value ofs according to a predetermined rate (the stationary degree value "a" changed by being multiplied by the constant C2). As a result, the larger the stationary degree value (stationary level) "a" (the longer the period during which a change in the movement of the remote control 32, i.e., the gyroscope unit 34, is small (stable)), the closer the modification offset value ofs is to be corrected to the angular velocity data "data" corrected in the step S49. In other words, the rate (level) at which the modification offset value ofs converges to the angular velocity data "data" corrected in the step S49 increases. In another example, the modification offset value ofs may be corrected only when a predetermined condition is satisfied (e.g., when a result obtained by subtracting the modification offset value ofs from the angular velocity data "data" is less than or equal to a predetermined value).

Figure 13:
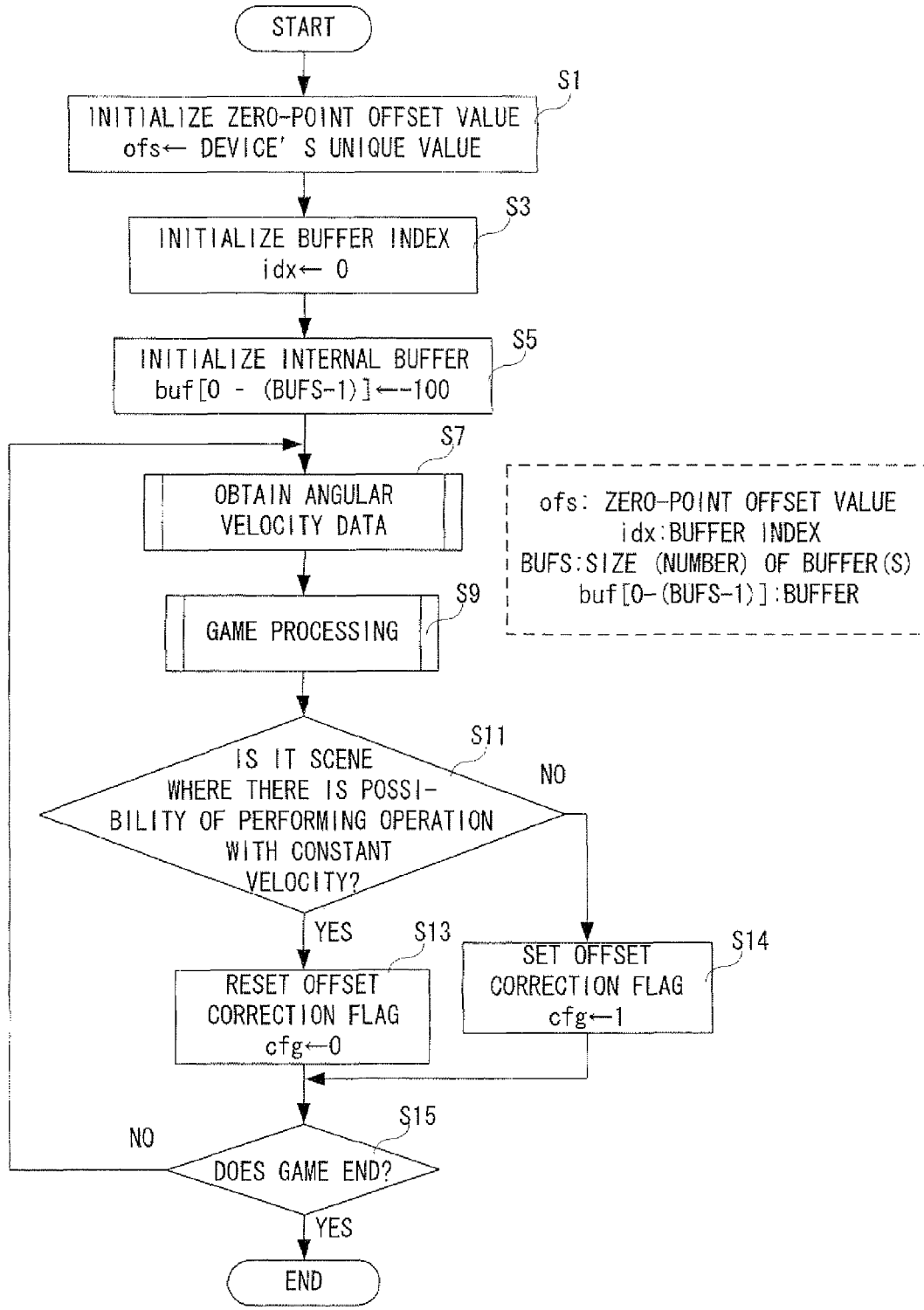
FIG. 13 is a flowchart showing game processing of a CPU shown in FIG. 4 in the embodiment.

Thereafter, in a step S55, taking into account a zero-point correction for an angular velocity outputted from the gyroscope 56, by subtracting the modification offset value ofs from the angular velocity data "data" corrected in the step S49, the angular velocity data "data" is corrected again and processing returns to the step S9 in FIG. 13. Note that when the step S11 in FIG. 13 branches to "YES" and the offset correction flag cfg is set to 0 in the step S13 and thus there is a possibility of performing an operation of moving the remote control 32, i.e., the gyroscope unit 34, with a constant velocity, the angular velocity data "data" is corrected using the modification offset value ofs that is not corrected in the step S53.

When, in the above-described manner, a determination as to whether the remote control 32, i.e., the gyroscope unit 34, such as those in the embodiment, is stable is made according to the magnitude of the stationary degree value "a" (the length of the period during which a change in the movement of the remote control 32, i.e., the gyroscope unit 34, is small (stable)), when the remote control 32, i.e., the gyroscope unit 34, is made to continuously move with constant velocity, too, a phenomenon occurs that it is determined that the stationary degree value (stationary level) "a" is large (the period during which a change in the movement of the remote control 32, i.e., the gyroscope unit 34, is small (stable) is long). For the correction to the angular velocity data "data" in the step S49, when a movement is continuously made with constant velocity, the same (or close) angular velocity data is continuously outputted from the controller 14, i.e., the remote control 32, and trackability to promptly reflect a movement with a large change is not required, and thus, there is no problem in adopting average value data with a heavy weight (the influence of an average value is great). However, for the correction to the modification offset value ofs in the step S53, the rate (level) at which the modification offset value ofs is corrected to a value close to the angular velocity data "data" corrected in the step S49 increases, and thus, there is a problem that a state in which the remote control 32, i.e., the gyroscope unit 34, is moving is corrected to angular velocity data (zero point) for a controller's stationary state. Note, however, that it can also be said that, in a game system such as that in the embodiment, since it is premised that the remote control 32, i.e., the gyroscope 56, is operated by a person holding it with his/her hand, the remote control 32, i.e., the gyroscope unit 34, cannot be continuously and accurately moved with constant velocity, like a machine, to the extent that a zero-point offset modification for an angular velocity takes place, and thus, there is no problem in practical use.

Even so, if an operation where such an inconvenient situation is likely to occur is required, there is a need to consider the timing at which the modification offset value ofs is corrected. For example, when a bow on a game screen is caused to move using the remote control 32, i.e., the gyroscope unit 34, to carefully aim at something, there is a possibility that the remote control 32, i.e., the gyroscope unit 34, is caused to quietly move with constant velocity. Therefore, in the present embodiment, for example, a zero-point offset modification processing function is turned on up until an arrow is fixed to the bow and the function is turned off when the arrow is fixed to the bow to perform careful aiming. As a criterion of such judgment, the aforementioned offset correction flag cfg is used.

Note that by additionally preparing a temperature sensor a zero-point offset value can be modified such that a temperature drift can be properly compensated for but it requires cost. On the other hand, since a zero-point offset value (modification offset value ofs) is corrected according to a stationary degree value (stationary level) "a", although in a simplified manner, without using a temperature sensor, the zero-point offset value (modification offset value ofs) can be corrected to reduce the influence of a temperature drift.

Note that although the above embodiment describes the case in which an output value from a gyroscope is converted into digital data, example embodiments of the present invention can be applied to any sensor that obtains digital data using such A/D conversion. For example, other motion sensors such as an acceleration sensor, a velocity sensor, a displacement sensor, and a rotation angle sensor may be used. Other than motion sensors, there are a tilt sensor, an image sensor, an optical sensor, a pressure sensor, a magnetic sensor, a temperature sensor, and the like, and in any sensor, example embodiments of the present invention can be applied to any apparatus that converts a detected analog value from a sensor into digital data and uses the digital data. Note, however, that for correction to a modified offset value ofs not all of the sensors are applicable. For example, an acceleration sensor does not have an idea of zero-point offset.

Now, effects of the present embodiment are verified by applying specific numerical values in the embodiment.

To facilitate checking of numerical values, parameters such as those shown below are used here.

C1=1, C2=1, CMAX=10, and k=1

An example in which a proper zero value is stably outputted

First, as a certain state, normal circumstances are shown in which the zero-point value of the gyroscope is "2.4" and the modification offset value ofs in a program is also "2.4". In this case, when the remote control 32, i.e., the gyroscope unit 34, is held by a hand and made stationary (not completely fixed), digital data to be inputted occasionally fluctuate such that an average value is statistically "2.4", for example, as follows:
digital data: 2 2 2 3 3 2 2 2 3 3.

In this case, the latest digital data is "2" or "3". In either case, the number of consecutive values (the number of consecutive units ct) in a range set in the past by a stable range (lower limit) d1 and a stable range (upper limit) d2 is equal to the maximum number of searches CMAX "10" and a stationary degree value "a" calculated in the step S47 in FIG. 14 is "1".

As a result, under circumstances, such as those described above, where it is premised that digital data whose average value is 2.4 are outputted, since angular velocity data "data" corrected in the step S49 is calculated by sum/ct, regardless of whether the latest value is "2" or "3", "2.4" is obtained.

Furthermore, a result of computation of a modification offset value ofs in the step S53 also remains as "2.4" without change. For the last output data in the step S55, as shown below, "2.4−2.4"=0.0 continues.

Digital data: 2 2 2 3 3 2 2 2 3 3
Analog output: 0.0 0.0 0.0 0.0 0.0 0.0 0.0 0.0 0.0 0.0
An example in which a correction is made when a zero point is changed Next, in the case in which the sensor's zero point is changed to "3.6" from the above-described state, when the remote control 32, i.e., the gyroscope unit 34, is made stationary, as with the above, a fluctuation that brings the average value to "3.6", such as that shown below, occurs.

Digital data: 2 2 2 3 3 (4) 4 4 3 3 4 4 4 3 3

Given that a zero-point change has occurred at parenthesized "4", sixth from left in the above-described digital data, variables in steps at this time are as shown in table 1.

TABLE 1

| Data(S33) | 2 | 2 | 2 | 3 | 3 | 4 | 4 | 4 | 3 | 3 | 4 | 4 | 4 | 3 | 3 |
|---|---|---|---|---|---|---|---|---|---|---|---|---|---|---|---|
| ct(S47) | 10 | 10 | 10 | 10 | 10 | 3 | 4 | 5 | 10 | 10 | 8 | 9 | 10 | 10 | 10 |
| a(S47) | 1.0 | 1.0 | 1.0 | 1.0 | 1.0 | 0.3 | 0.4 | 0.5 | 1.0 | 1.0 | 0.8 | 0.9 | 1.0 | 1.0 | 1.0 |
| sum(S49) | 24 | 24 | 24 | 24 | 24 | 10 | 14 | 18 | 30 | 30 | 28 | 32 | 36 | 36 | 36 |
| data(S49) | 2.4 | 2.4 | 2.4 | 2.4 | 2.4 | 3.8 | 3.8 | 3.8 | 3.0 | 3.0 | 3.6 | 3.6 | 3.6 | 3.6 | 3.6 |
| ofs(S53) | 2.4 | 2.4 | 2.4 | 2.4 | 2.4 | 2.8 | 3.2 | 3.5 | 3.0 | 3.0 | 3.5 | 3.6 | 3.6 | 3.6 | 3.6 |
| data(S55) | 0.0 | 0.0 | 0.0 | 0.0 | 0.0 | 1.0 | 0.6 | 3.0 | 0.0 | 0.0 | 0.1 | 0.0 | 0.0 | 0.0 | 0.0 |

That is, the results are as follows and even if the zero point is changed, output data eventually settles to "0.0".
Digital data: 2 2 2 3 3 4 4 4 3 3 4 4 4 3 3
Analog output: 0.0 0.0 0.0 0.0 0.0 0.0 (1.0) 0.6 0.3 0.0 0.0 0.0 0.1 0.0 0.0 0.0 0.0

Accordingly, a zero-point correction starts from data, seventh from left, and the correction is completed on data, twelfth from left.

An example in which when the sensor is moved the movement is promptly reflected in output data Furthermore, when a rotation in a positive direction is performed from the above-described state, inputs such as those shown below, for example, are obtained.
Digital data: 4 4 4 3 3 4 (5) 6 7 8 10 12 16 20 25

Given that a rotation is started at parenthesized "5" seventh from left in the above-described digital data, variables in steps at this time are as shown in table 2.

TABLE 2

| data(S33) | 4   | 4   | 4   | 3   | 3   | 4   | 5   | 6   | 7   | 8   | 10  | 12  | 16  | 20   | 25   |
|-----------|-----|-----|-----|-----|-----|-----|-----|-----|-----|-----|-----|-----|-----|------|------|
| ct(S47)   | 8   | 9   | 10  | 10  | 10  | 10  | 2   | 2   | 2   | 2   | 1   | 1   | 1   | 1    | 1    |
| a(S47)    | 0.8 | 0.9 | 1.0 | 1.0 | 1.0 | 1.0 | 0.2 | 0.2 | 0.2 | 0.2 | 0.1 | 0.1 | 0.1 | 0.1  | 0.1  |
| sum(S49)  | 28  | 32  | 36  | 36  | 36  | 36  | 9   | 11  | 13  | 15  | 10  | 12  | 16  | 20   | 25   |
| data(S49) | 3.6 | 3.6 | 3.6 | 3.6 | 3.6 | 3.6 | 4.9 | 5.9 | 6.9 | 7.9 | 10  | 12  | 16  | 20   | 25   |
| ofs(S53)  | 3.5 | 3.6 | 3.6 | 3.6 | 3.6 | 3.6 | 3.9 | 4.3 | 4.8 | 5.4 | 5.9 | 6.5 | 7.4 | 8.7  | 10.3 |
| data(S55) | 0.1 | 0.0 | 0.0 | 0.0 | 0.0 | 0.0 | 1.0 | 1.6 | 2.1 | 2.5 | 4.1 | 5.5 | 8.6 | 11.3 | 14.7 |

That is, the results are as follows and results that track the inputs are obtained.
Digital input: 4 4 4 3 3 4 5 6 7 8 10 12 16 20 25
Analog output: 0.1 0.0 0.0 0.0 0.0 0.0 0.0 (1.0) 1.6 2.1 2.5 4.1 5.5 8.6 11.3 14.7

Therefore, at parenthesized "1.0", seventh from left, a rotation occurs.

Note that although in this example there is a slight delay in a change in output, this is because the parameters used in the example here have extreme values so that a zero-point correction can be verified even with a small number of data samples. In an adjustment that a zero-point correction is immediately made, trackability for when the gyroscope is moved becomes slow. However, in the actual case, a zero-point correction is adjusted to change while several hundred data samples are taken, and accordingly, trackability for when the gyroscope is moved does not have a delay such as that occurred in the example here.

Although, in the above-described embodiment, the gyroscope unit 34 (gyroscope 56) is connected to the remote control 32, the gyroscope 56 may be built in the remote control 32.

Also, although, in the above-described embodiment, digital data (angular velocity data) outputted from a predetermined sensor (a gyroscope in the embodiment) is corrected with a stationary degree, and the like, being calculated using digital data (angular velocity data) outputted from the same sensor (gyroscope), a correction may be made with a stationary degree, and the like, being set using digital data outputted from a different sensor. For example, digital data (angular velocity data) outputted from a gyroscope may be corrected with a stationary degree being calculated from digital data (acceleration data) outputted from an acceleration sensor.

Although example embodiments of the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-transitory storage medium that tangibly stores a digital data correction program in such a manner that the program is readable by a computer of a digital data correction apparatus that corrects digital data obtained based on an output from a predetermined sensor, said digital data correction program causing said computer to provide functionality comprising:

a buffering for sequentially storing digital data in a buffer;

a range calculation for calculating a range for latest digital data;

an average value calculation for calculating an average value of those of the digital data stored in said buffer that are consecutively present in said range going backward from said latest digital data; and a data correction for correcting said latest digital data using the average value calculated by said average value calculation.

2. The non-transitory storage medium according to claim 1, wherein
said digital data correction program further causes said computer to provide functionality comprising a number-of-consecutive-unit calculation for calculating a number of consecutive units of those of the digital data stored in said buffer that are consecutively present in said range going backward from said latest digital data, and
a weighted average value calculation for calculating a weighted average value of said latest digital data and said average value based on said number of consecutive units, and uses said weighted average value as corrected digital data.

3. The non-transitory storage medium according to claim 1, wherein said range is a range including said latest digital data.

4. The non-transitory storage medium according to claim 1, wherein
said digital data correction program further causes said computer to provide functionality comprising:
a number-of-consecutive-unit calculation for calculating a number of consecutive units of those of the digital data stored in said buffer that are consecutively present in said range going backward from said latest digital data;
a modification offset value calculation for calculating, according to said number of consecutive units, a modification offset value that converges to digital data corrected by said data correction; and
an offset correction for correcting the digital data corrected by said data correction, using said modification offset value.

5. The non-transitory storage medium according to claim 1, wherein said data correction includes a data output for outputting corrected digital data that is obtained by correcting said latest digital data using the average value calculated by said average value calculation.

6. The non-transitory storage medium according to claim 1, wherein said sensor includes a gyroscope and said digital data is angular velocity data.

7. The non-transitory storage medium according to claim 1, wherein the range is a stable range including an upper limit and a lower limit.

8. The non-transitory storage medium according to claim 1, wherein the range is a predetermined range.

9. The non-transitory storage medium according to claim 1, wherein the digital data stored in the buffer is received from an A/D converter.

10. The non-transitory storage medium according to claim 2, wherein said weighted average value calculation increases a weight of said average value as said number of consecutive units becomes larger.

11. The non-transitory storage medium according to claim 3, wherein said range is a range with equal upper and lower bounds with said latest digital data being a center.

12. The non-transitory storage medium according to claim 4, wherein said modification offset value calculation calculates a modification offset value with a higher level of convergence to the digital data corrected by said data correction, as said number of consecutive units becomes larger.

13. The non-transitory storage medium according to claim 6, wherein said gyroscope digital data is provided to a controller of a game machine and said game machine performs game processing based on said digital data.

14. The non-transitory storage medium according to claim 10, wherein said weighted average value calculation increases the weight of said average value in proportion to a power of said number of consecutive units.

15. The non-transitory storage medium according to claim 12, wherein said modification offset value calculation calculates a modification offset value with a higher level of convergence to the digital data corrected by said data correction, in proportion to a power of said number of consecutive units.

16. A digital data correction apparatus that corrects digital data obtained based on an output from a predetermined sensor, said apparatus comprising:
a buffer for sequentially storing digital data; and
a computer processing system, including at least one computer processor, the computer processing system being configured to provide functionality comprising:
range calculation for calculating a range for latest digital data;
an average value calculation for calculating an average value of those of the digital data stored in said buffer that are consecutively present in said range going backward from said latest digital data; and
a data correction for correcting said latest digital data using the average value calculated by said average value calculation.

17. A computer-implemented method of correcting digital data obtained based on an output from a predetermined sensor, the method comprising:
sequentially storing digital data in a buffer;
calculating, using a computer processor, a range for latest digital data;
calculating an average value of those of the digital data stored in said buffer that are consecutively present in said range going backward from said latest digital data; and
correcting said latest digital data using the calculated average value.

18. The method according to claim 17, further comprising:
calculating a number of consecutive units of those of the digital data stored in said buffer that are consecutively present in said range going backward from said latest digital data, and
calculating a weighted average value of said latest digital data and said average value based on said number of consecutive units, and using said weighted average value as corrected digital data.

19. The method according to claim 17, wherein said range is a range including said latest digital data.

20. The method according to claim 17, further comprising:
calculating a number of consecutive units of those of the digital data stored in said buffer that are consecutively present in said range going backward from said latest digital data;
calculating, according to said number of consecutive units, a modification offset value that converges to corrected digital data; and
correcting the corrected digital data using said modification offset value.

21. The method according to claim 17, further comprising outputting corrected digital data that is obtained by correcting said latest digital data using the calculated average value.

22. The method according to claim 17, wherein said sensor includes a gyroscope and said digital data is angular velocity data.

23. The method according to claim 17, wherein the range is a stable range including an upper limit and a lower limit.

24. The method according to claim 17, wherein the range is a predetermined range.

25. The method according to claim 17, wherein the digital data stored in the buffer is received from an A/D converter.

26. The method according to claim 18, wherein a weight of said average value is increased as said number of consecutive units becomes larger.

27. The method according to claim 19, wherein said range is a range with equal upper and lower bounds with said latest digital data being a center.

28. The method according to claim 20, wherein a modification offset value is calculated with a higher level of convergence to the corrected digital data, as said number of consecutive units becomes larger.

29. The method according to claim 22, wherein said gyroscope digital data is provided to a controller of a game machine and game processing is performed based on said digital data.

30. The method according to claim 26, wherein the weight of said average value is increased in proportion to a power of said number of consecutive units.

31. The method according to claim 28, wherein a modification offset value is calculated with a higher level of convergence to the corrected digital data in proportion to a power of said number of consecutive units.

32. A computer-implemented method of correcting digital data obtained based on an output from a predetermined sensor, said method comprising:
sequentially storing digital data in a buffer;
calculating, using a computer processor, a range for latest digital data;
calculating an average value of those of the digital data stored in said buffer that are consecutively present in said range going backward from said latest digital data; and
correcting said latest digital data using the calculated average value.

* * * * *